United States Patent
Keskin et al.

(10) Patent No.: US 12,341,526 B2
(45) Date of Patent: Jun. 24, 2025

(54) SHARED PHASE-LOCKED LOOP (PLL) CIRCUITRY FOR MULTIPLE TRANSMISSION CHAINS

(71) Applicant: QUALCOMM Incorporated, San Diego, CA (US)

(72) Inventors: Mustafa Keskin, San Diego, CA (US); Roberto Rimini, San Diego, CA (US); Danlu Zhang, San Diego, CA (US); Bala Ramasamy, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 104 days.

(21) Appl. No.: 18/471,230

(22) Filed: Sep. 20, 2023

(65) Prior Publication Data

US 2025/0096807 A1    Mar. 20, 2025

(51) Int. Cl.
*H03L 7/099* (2006.01)
*H03L 7/195* (2006.01)

(52) U.S. Cl.
CPC ............ *H03L 7/0992* (2013.01); *H03L 7/195* (2013.01)

(58) Field of Classification Search
CPC ............................... H03L 7/0992; H03L 7/195
See application file for complete search history.

(56) References Cited

U.S. PATENT DOCUMENTS

| | | | |
|---|---|---|---|
| 2018/0098351 A1* | 4/2018 | Amel | H04B 1/0053 |
| 2019/0305803 A1* | 10/2019 | Winiecki | H04B 1/48 |
| 2019/0324118 A1* | 10/2019 | Storz | G01S 7/03 |
| 2021/0173069 A1 | 6/2021 | Wu et al. | |
| 2023/0273297 A1 | 8/2023 | Bai et al. | |

OTHER PUBLICATIONS

International Search Report and Written Opinion—PCT/US2024/043768—ISA/EPO—Nov. 13, 2024.

\* cited by examiner

*Primary Examiner* — Sung S Ahn
(74) *Attorney, Agent, or Firm* — Polsinelli/Qualcomm Incorporated

(57) ABSTRACT

Aspects described herein include devices and methods for phase lock loop (PLL) output sharing between multiple communication chains in a wireless communication apparatus. In one aspect, an apparatus includes phase locked loop (PLL) circuitry having a shared PLL output, radar signal generation circuitry, a first transmission chain coupled to the shared PLL output and the radar signal generation circuitry, and a second transmission chain coupled to the shared PLL output and the radar signal generation circuitry.

30 Claims, 15 Drawing Sheets

900

Generate a first radar signal using radar signal generation circuitry and a first transmission chain coupled to shared PLL circuitry
902

Generate a second radar signal using the radar signal generation circuitry and a second transmission chain coupled to the shared PLL circuitry
904

SHARED PHASE-LOCKED LOOP (PLL) CIRCUITRY FOR MULTIPLE TRANSMISSION CHAINS

FIELD

The present disclosure relates generally to electronics and wireless communications. For example, aspects of the present disclosure relate to transmission chain circuitry with multiple transmission chains. Some aspects are particularly used for generating multiple orthogonal millimeter wave radar transmissions.

BACKGROUND

Wireless communication devices and technologies are becoming ever more prevalent. Wireless communication devices generally transmit and receive communication signals. Radio frequency front end (RFFE) modules are wireless communication apparatuses that power wireless transmit signals, and can also manage reception of wireless signals from an antenna. With the increasing prevalence of wireless communication technologies and increasing communication system throughputs and increasing complexity of power management for wireless devices, RFFE modules are becoming a larger component of wireless devices. Limiting power usage and managing power efficiency is an important goal of device design, particularly for mobile devices. Additionally, some such systems can integrate millimeter wave technology that can be used for communications and/or for radar applications.

SUMMARY

Various implementations of systems, methods, and devices within the scope of the appended claims each have several aspects, no single one of which is solely responsible for the desirable attributes described herein. Without limiting the scope of the appended claims, some prominent features are described herein.

In some aspects, a method is provided. The method includes: generating a first radar signal using radar signal generation circuitry and a first transmission chain coupled to shared PLL circuitry, generating a second radar signal using the radar signal generation circuitry and a second transmission chain coupled to the shared PLL circuitry.

In another aspect, an apparatus for wireless communication is provided. The apparatus includes: means for generating a first radar signal using radar signal generation circuitry and a first transmission chain coupled to shared PLL circuitry, means for generating a second radar signal using the radar signal generation circuitry and a second transmission chain coupled to the shared PLL circuitry.

In another aspect, a wireless communication apparatus is provided. The apparatus comprises phase locked loop (PLL) circuitry having a shared PLL output, radar signal generation circuitry, a first transmission chain coupled to the shared PLL output and the radar signal generation circuitry, and a second transmission chain coupled to the shared PLL output and the radar signal generation circuitry.

Some such aspects are configured where the shared PLL output is coupled to a mixer of the first transmission chain via local oscillator (LO) circuitry. Some such aspects are configured where the shared PLL output is coupled to a mixer of the second transmission chain via the LO circuitry and first frequency divider circuitry.

Some such aspects are configured with a third transmission chain coupled to the shared PLL output via the LO circuitry and second frequency divider circuitry separate from the first frequency divider circuitry.

Some such aspects are configured where the first transmission chain and the second transmission chain comprise the shared PLL output, where the PLL circuitry is configured to generate a shared transmission signal using a frequency modulated continuous wave (FMCW) modulation input, where transmission circuitry of the second transmission chain is coupled to the shared PLL output via frequency divider circuitry, and where transmission circuitry of the first transmission chain is coupled to the shared PLL output.

Some such aspects are configured with a third transmission chain coupled to the shared PLL output via second frequency divider circuitry separate from the first frequency divider circuitry. Some such aspects are configured where the transmission circuitry of the first transmission chain is configured to output a first radar transmission at a shared frequency with the shared transmission signal, and where the transmission circuitry of the second transmission chain is configured to output a second radar transmission at second frequency shifted from the shared frequency by the frequency divider circuitry.

Some such aspects are configured where the first transmission chain and the second transmission chain comprise a shared mixer, where the shared PLL output is coupled to a LO input of the shared mixer, and where transmission circuitry of the second transmission chain is coupled to an output of the shared mixer via frequency divider circuitry. Some such aspects are configured where transmission circuitry of the first transmission chain is separate from the transmission circuitry of the second transmission chain and is coupled to the output of the shared mixer without intervening frequency divider circuitry. Some such aspects are configured where the radar signal generation circuitry comprises shared frequency modulated continuous wave-intermediate frequency (FMCW-IF) signal generation circuitry coupled to a signal input of the shared mixer. Some such aspects are configured where the first frequency divider circuitry comprises a programmable divider.

Some such aspects are configured where the first transmission chain and the second transmission chain share frequency modulated continuous wave-intermediate frequency (FMCW-IF) circuitry and IQ generation circuitry coupled to the FMCW-IF circuitry, where a first output of the IQ generation circuitry is coupled to transmission circuitry of the first transmission chain via a first mixer of the first transmission chain, where a second or split output of the IQ generation circuitry is coupled to transmission circuitry of the second transmission chain via a second mixer of the second transmission chain.

Some such aspects are configured where the apparatus is configured to transmit multiple radar signals concurrently at different respective frequencies via the first transmission chain and the second transmission chain.

Some such aspects are configured where the first transmission chain and the second transmission share frequency modulated continuous wave-intermediate frequency (FMCW-IF) circuitry. Some such aspects are configured where a first output of the FMCW-IF circuitry is coupled to transmission circuitry of the first transmission chain via a first mixer of the first transmission chain, where a second or split output of the FMCW-IF circuitry is coupled to transmission circuitry of the second transmission chain via a second mixer of the second transmission chain. Some such aspects are configured where the second or split output of the FMCW-IF circuitry is coupled to the second mixer via frequency adjustment circuitry. Some such aspects are configured where the frequency adjustment circuitry comprises interference reduction circuitry. Some such aspects are configured where the frequency adjustment circuitry comprises frequency offset circuitry.

Some such aspects are configured where the first transmission chain generates a first signal, and where the second transmission chain generates a second signal orthogonal to the first signal. Some such aspects are configured where the first signal is a first pseudorandom (PN) shaped signal, and where the second signal is a second PN shaped signal orthogonal to the first PN shaped signal.

Some such aspects are configured where the first transmission chain and the second transmission chain are configured for transmission in a first transmission direction, where a chirp pattern for a transmission signal of the first transmission chain is orthogonal to a chirp pattern of a transmission signal of the second transmission chain.

Some such aspects are configured where a third transmission chain and a fourth transmission chain are configured for transmission in a second transmission direction orthogonal to the first transmission direction, and where a chirp pattern for a transmission signal of the third transmission chain is orthogonal to a chirp pattern of a transmission signal of the fourth transmission chain.

Some such aspects are configured with a shared receive path, and processing circuitry configured to perform source separation on received signals to identify separate return chirp signals from the first transmission chain and the second transmission chain.

Some such aspects are configured where the processing circuitry is configured to identify the separate return chirp signals using a trained source separation machine learning algorithm. Some such aspects are configured where the trained source separation machine learning algorithm identifies the separate return chirp signals using one or more of a signal level, a signal index, a signal slope-direction, and a signal frequency domain.

Some such aspects are configured where the first transmission chain is disposed in a first radio frequency front end (RFFE) module, and where the second transmission chain is disposed in a second RFFE module. Some such aspects are configured where the first RFFE module comprises a first antenna coupled to the first transmission chain, where the first antenna covers a first spatial location, where the second RFFE module comprises a second antenna coupled to the second transmission chain, where the second antenna covers a second spatial location different from the first spatial location.

In some aspects, the apparatuses described above can function in a system that includes a mobile device with a camera for capturing one or more pictures. In some aspects, the apparatuses described above can include a display screen for displaying one or more images or interface displays. In some aspects, additional wireless communication circuitry is provided. The summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and embodiments, will become more apparent upon referring to the following specification, claims, and accompanying drawings.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 1I is a diagram illustrating an environment that includes an electronic device and a base station that can be used with aspects of the present disclosure.

DETAILED DESCRIPTION

Figure 1:
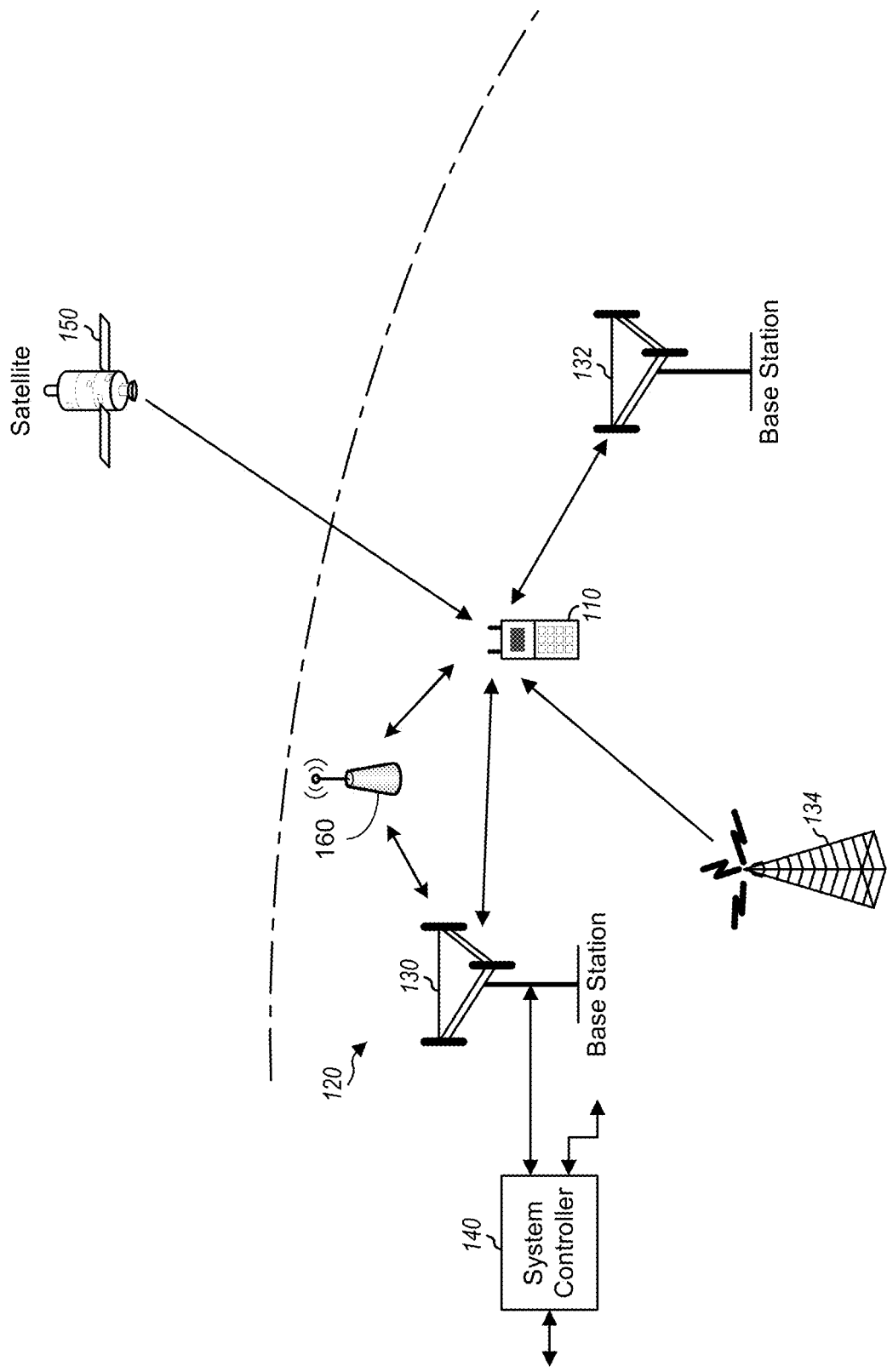
FIG. 1 is a diagram showing a wireless communication system communicating with a wireless device that can be implemented according to aspects described herein.

The detailed description set forth below in connection with the appended drawings is intended as a description of example aspects and implementations and is not intended to represent the only implementations in which the invention may be practiced. The detailed description includes specific details for the purpose of providing a thorough understanding of the example aspects and implementations. In some instances, some devices are shown in block diagram form. Drawing elements that are common among the following figures may be identified using the same reference numerals.

The progression of wireless communication infrastructure, such as for Third Generation Partnership Project (3GPP) fifth generation (5G) millimeter wavelength (mmW) systems, involves increasing importance of the radio frequency (RF) front end (RFFE). For example, 5G standards for cellular communications involve increasing complexity of frequency combinations and communication throughput options. Further, with communications systems extending into higher frequencies, including millimeter wave (mmW) frequencies, additional functions such as radar applications for local object detection, 3D mapping, positioning, gesture detection, and other such applications can be included in such an RFFE.

Aspects described herein include architectures for supporting multiple RFFE radar transmission subsystems. Each such subsystem can include a transmission chain, with some portions of the different chains being shared (e.g., phase-locked loop circuitry) and other portions being separate. Some aspects of such an architecture can operate to enable different radar transmissions with unique combinations of characteristics, including bandwidth and carrier frequency. Such characteristics can allow improved range and wider sliding resolution, with shared common blocks reducing power usage. As described herein, an individual chain is circuitry for separate transmission of a radar signal. An individual chain can include multiple paths for signals of phased array operations, such that, as described herein, individual signals to separate elements of a phased array are not separate chains, but part of a chain for a phased array. In some aspects, separate chains are configured for simultaneous transmission of radar signals.

Additionally, the radar transmissions can be given pseudorandom (PN) shaping at different transmission chains to improve the orthogonality and simplify source separation processing in receiver circuitry. Trained machine learning processing systems at the receiver circuitry can further be used to perform source separation. Such source separation can provide a benefit, particularly in the context of continuous and/or simultaneous transmission of radar signals from separate transmission chains.

Further details regarding aspects described herein are provided with respect to the figures below.

FIG. 1 is a diagram showing a wireless device 110 communicating with a wireless communication system 120. In accordance with aspects described herein, the wireless device can include electronic devices with wireless communication capabilities enabled by RFFE circuitry along with other wireless communication elements. Devices such as the wireless device 110 within the system 120 can use multiple radar subsystems or modules with shared elements in accordance with aspects described herein.

The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. Communication elements of the wireless device 110 for implementing mmW and non-mmW communications in accordance with any such communication standards can be supported by various designs of transceivers, e.g., using a chained signal routing. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, or other such mobile device (e.g., a device integrated with a display screen). Other examples of the wireless device 110 include a wireless modem, a personal digital assistant (PDA), a handheld device, a laptop computer, a smartbook, a netbook, a tablet, a cordless phone, a medical device, a device configured to connect to one or more other devices (for example through the internet of things), an automobile or other automotive device, a wireless local loop (WLL) station, a Bluetooth device, etc. Wireless device 110 may communicate with wireless communication system 120. Wireless device 110 may also receive signals from broadcast stations (e.g., a broadcast station 134) and/or communicate with satellites (e.g., a satellite 150 in one or more global navigation satellite systems (GNSS), etc.). Wireless device 110 may support one or more radio technologies for wireless communication such as LTE, WCDMA, CDMA 1X, EVDO. TD-SCDMA, GSM, 802.11, 5G, etc.

The wireless communication system 120 may also include a wireless device 160. In an exemplary embodiment, the wireless device 160 may be a wireless access point, or another wireless communication device that comprises, or comprises part of a wireless local area network (WLAN). In an exemplary embodiment, the wireless device 110 may be configured as a customer premises equipment (CPE), which may be in communication with a base station 130 and another wireless device 110, or other devices in the wireless communication system 120. In some embodiments, the CPE may be configured to communicate with the wireless device 160 using WAN signaling and to interface with the base station 130 based on such communication instead of the wireless device 160 directly communicating with the base station 130. In exemplary embodiments where the wireless device 160 is configured to communicate using WLAN signaling, a WLAN signal may include WiFi, or other communication signals.

Figure 2:
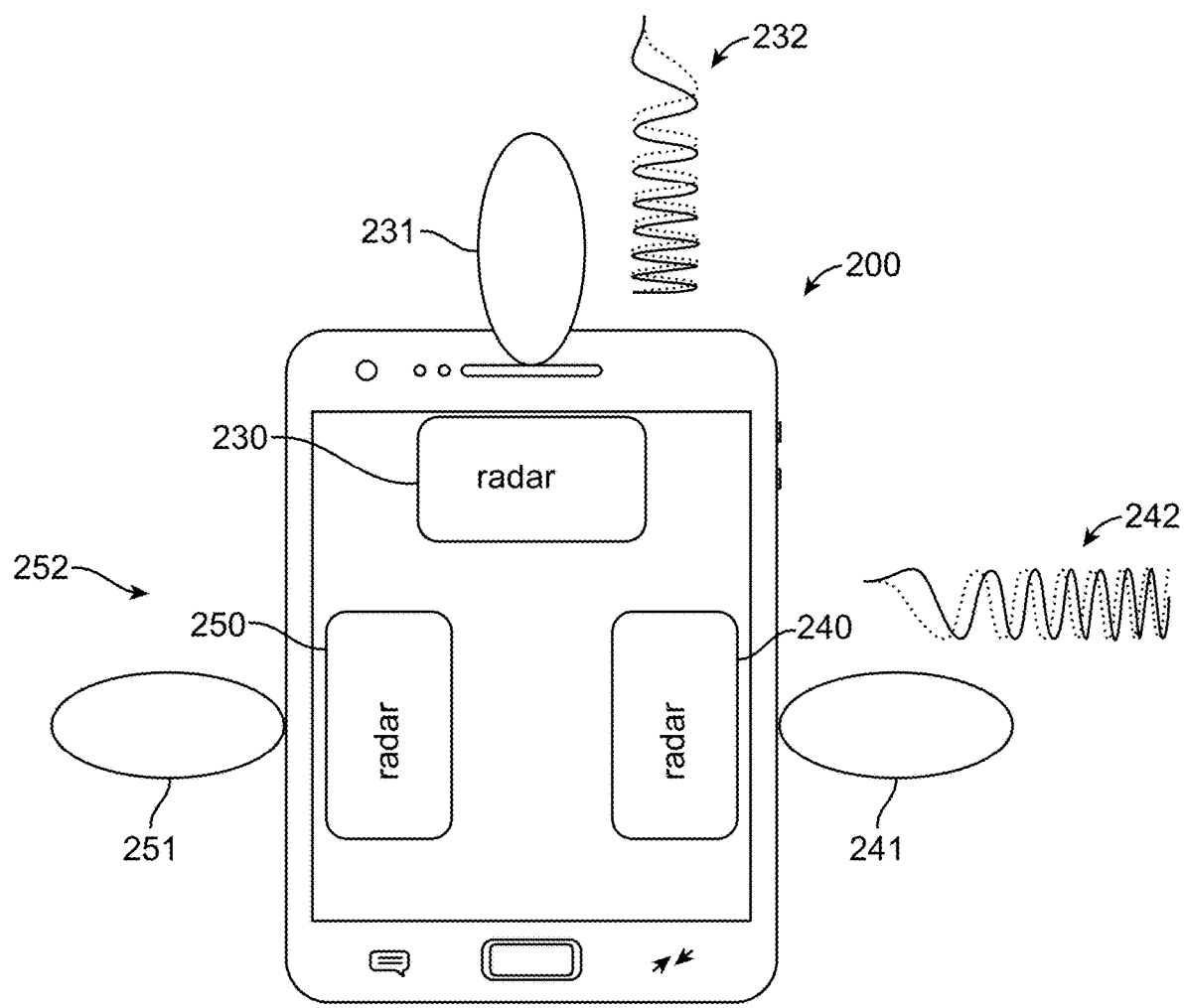
FIG. 2 is a block diagram showing a device including subsystems to support multiple orthogonal transmissions with shared phase-locked loop (PLL) circuitry in accordance with aspects described herein.
Figure 11:
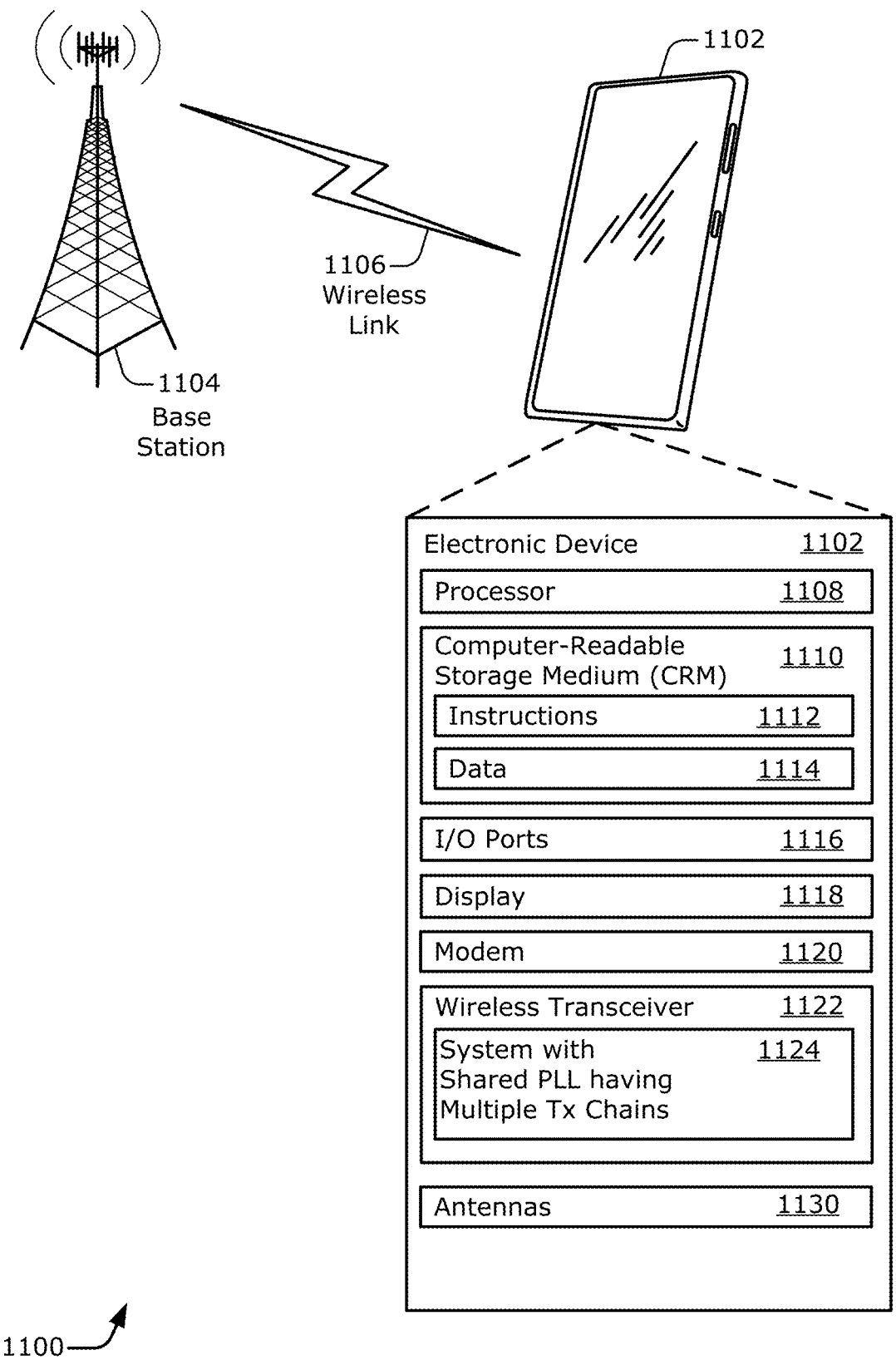
Figure 12:
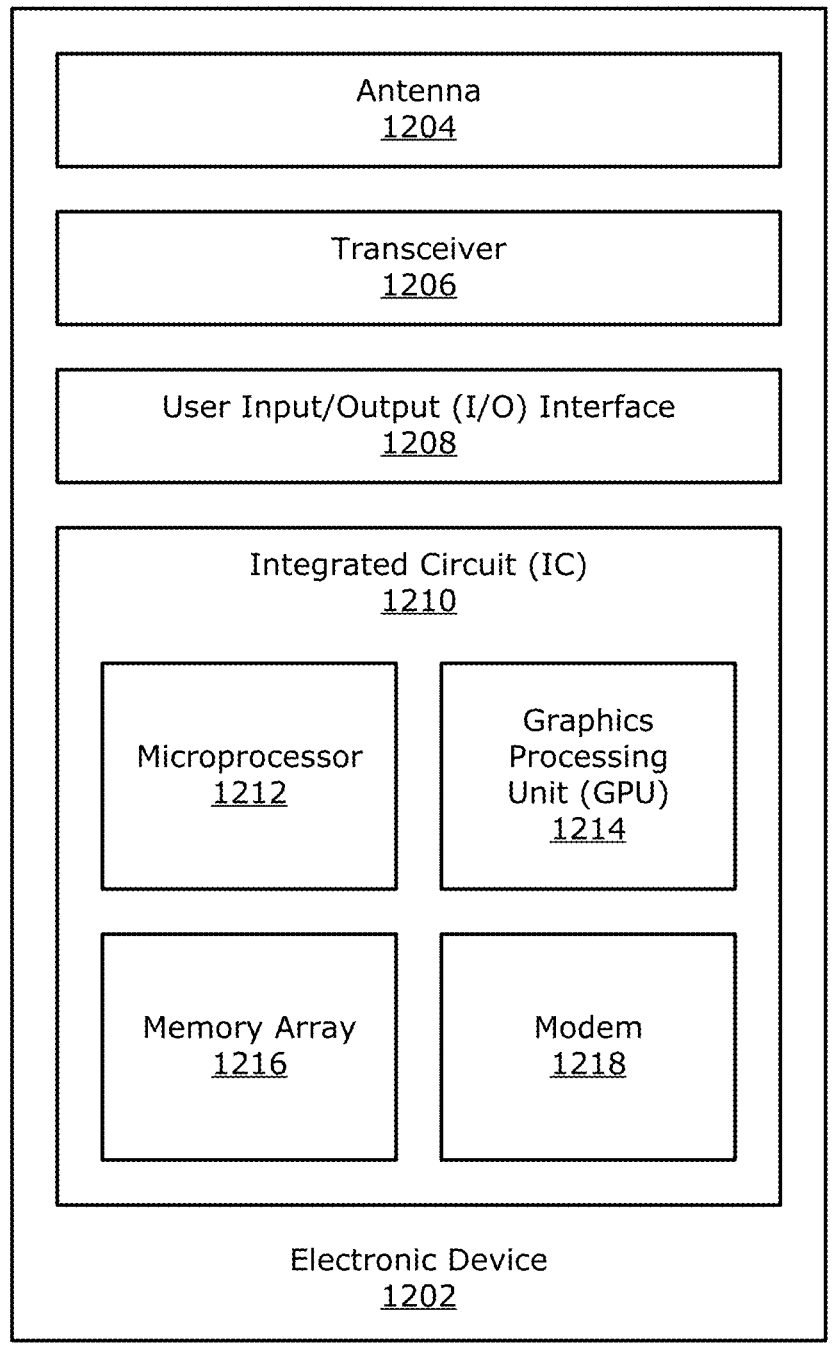
FIG. 12 is a diagram of an electronic device that can be used with aspects of the present disclosure.

FIG. 2 is a block diagram showing a wireless device 200 in which aspects of the present disclosure may be implemented. The wireless device 200 can be a communication device such as the wireless device 110, an electronic device 1102 as illustrated in FIG. 11, an electronic device 1202 as illustrated in FIG. 12, or any device described herein or other such devices. As illustrated, the wireless device 200 includes a plurality of radar subsystems 230, 240, and 250. Each radar subsystem of the radar subsystems 230, 240, and 250 has an associated transmission chain. In some examples, one or more of the radar subsystems 230, 240, 250 are packaged into respective modules, for example including the associated transmission chain and an array of antennas. In some such examples the transmission chain (or multiple transmission chains) are implemented in a RF integrated circuit (RFIC). Several aspects described herein are discussed in the context of mmW communications and mmW transmission chains. Any frequency suitable for a particular radar application can be used in accordance with the details provided herein. In some aspects, depending on resource configurations of RF blocks in an apparatus, the radar modules may cover FR1, FR2, and/or FR3. In some aspects, the radar modules may cover sub-6 GHz frequencies. In some aspects, 24.25 GHz-52.6 GHz and/or 6 GHz-24.25 GHz may be covered. In other aspects, other frequency ranges may be covered. The wireless device 200 uses the subsystems 230, 240, and 250 to perform simultaneous radar signal transmission. The different radar signal transmissions are generated with different characteristics that allow one or more receivers to distinguish return signals based on the different characteristics (e.g., matching details of a signal at a single receiver to an associated transmission chain).

The three subsystems 230, 240, and 250 are shown as having a separate associated directionality. The subsystem 230 is associated with a first transmission direction 231, the subsystem 240 is associated with a second transmission direction 241, and the subsystem 250 is associated with a third transmission direction 251. While three subsystems with three associated transmission directions are shown, a device can have any number of associated transmission directions and any number of subsystems, for example such that a receiver is capable of separating signals received from different transmission chains or the signals are sufficiently separated spatially (e.g., where a return from a signal in the transmission direction 251 is unlikely to be received at a receiver of subsystem 240 sensing in the transmission direction 241). In some examples, a radar subsystem is configured to transmit in more than one direction, for example two substantially orthogonal directions.

In addition to the separation of transmission signals spatially with transmission directionality for each of the radar subsystems 230, 240, and 250, each subsystem 230, 240, and 250 may additionally include multiple transmission chains, with each transmission chain of an individual subsystem generating transmission signals with distinguishing characteristics. For example, the radar subsystem 240 can generate two transmission signals 242 which have different combinations of bandwidth and/or carrier frequency characteristics, and/or which can have pseudorandom chirped signal shaping to generate orthogonal chirped signals.

As illustrated, the subsystem 230 can generate multiple transmission signals 232 in the transmission direction 231, the subsystem 240 can generate multiple transmission signals 242 in the transmission direction 241, and the subsystem 250 can generate multiple transmission signals 252 in the transmission direction 251. The transmission signals from different subsystems 230, 240, and 250 are thus separated spatially, and the transmission signal from individual subsystems have differing characteristics and/or signal chirp shaping. Not every radar subsystem in the wireless device 200, however, is required to generate multiple signals with different characteristics and any of the subsystems 230, 240, 250 may omit such functionality.

Different implementations of the device 200 can include individual subsystems with any number of transmission chains. The subsystem 230 can include a plurality of mmW transmission chains comprising a first mmW transmission chain and a second mmW transmission chain to generate the transmission signals 232 in the first transmission direction 231, where a chirp pattern for a transmission signal of the first mmW transmission chain is orthogonal to a chirp pattern of a transmission signal of the second mmW transmission chain. The subsystem 240 can include a third mmW transmission chain and a fourth transmission chain configured for transmission in the second transmission direction 241 orthogonal to the first transmission direction, wherein a chirp pattern for a transmission signal of the third mmW transmission chain is orthogonal to a chirp pattern of a transmission signal of the fourth mmW transmission chain. The chirp patterns for the transmission signals 242 of the subsystem 240 can be similar to the chirp patterns of the signals 232, or can be different, depending on the design and the spatial separation of the transmission direction 231 and the transmission direction 241. If all transmissions are orthogonally chirped, overlap between the transmission directions and the expected return signal can be tolerated to some extent, with processing of the return signals to separate the return signals by source used (e.g., separate return chirp signals can be identified from a single receive signal by a PN chirp envelope and/or any other distinguishing characteristics). While the above example describes a limited number of subsystems and transmission chains per subsystem, any number of subsystems and transmission chains (e.g., with transmission signals having differing characteristics that can be separated by receive processing) can be used in different implementations.

Return signals from the radar transmissions of each subsystem 230, 240, and 250 are spatially separated from what may otherwise be similar transmissions from another subsystem 230, 240, and 250. The return signals from different transmission chains and combinations of transmission signals 232, 242, and 252 can be separated based on the characteristics and/or PN chirp shaping. Such separation can be performed using trained machine-learning systems, for example. Additional details of such operations are described below with respect to FIGS. 8A and 8B.

Figure 3:
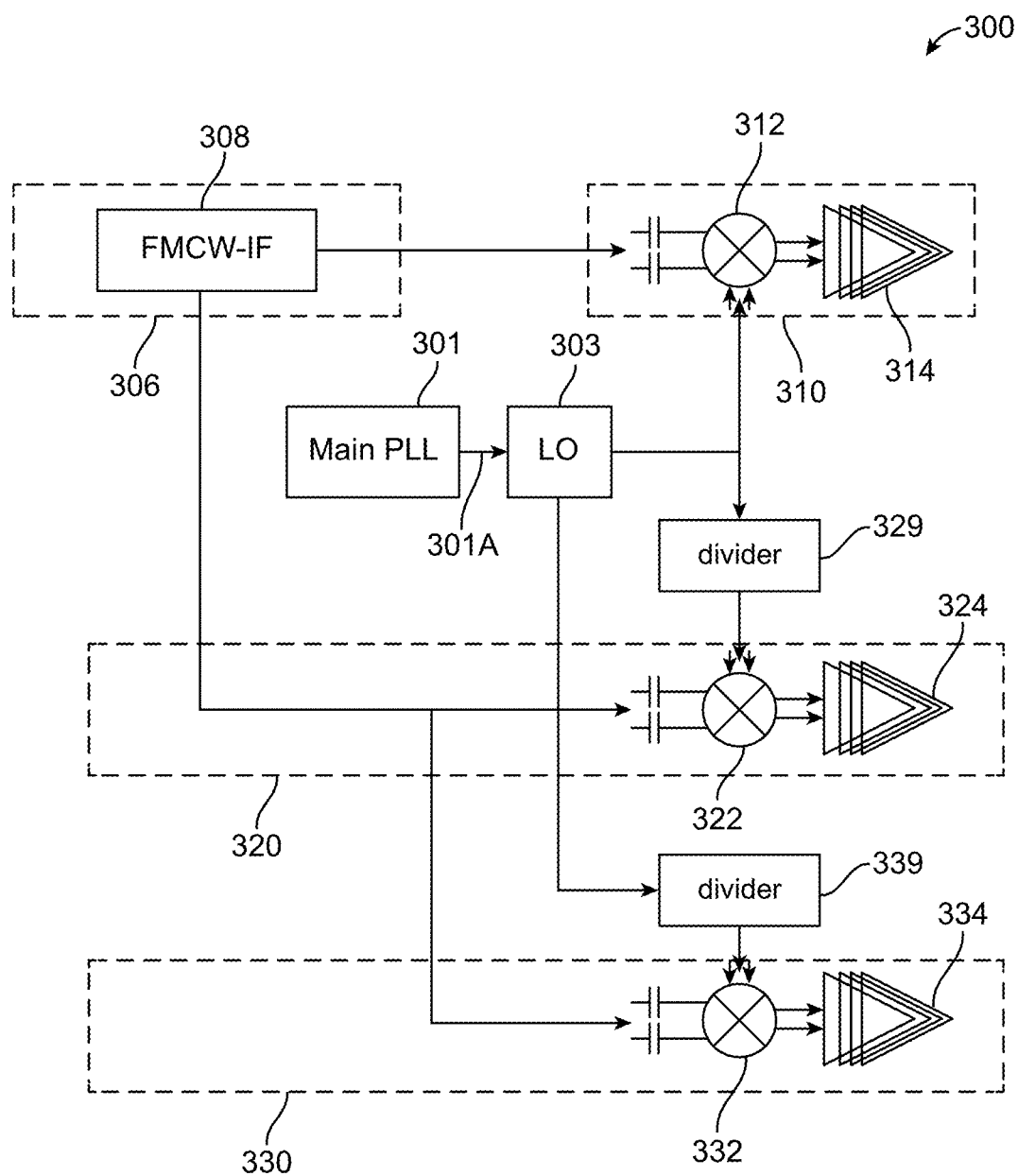
FIG. 3 is a schematic illustrating elements of one implementation of a system with multiple transmission chains supported by shared PLL circuitry in accordance with aspects described herein.

FIG. 3 is a schematic illustrating elements of one implementation of a system 300 with multiple transmission chains supported by shared PLL circuitry 301 in accordance with aspects described herein.

In the system 300, three mmW transmission chains are illustrated. All three transmission chains include shared circuitry 306, which in FIG. 3 includes shared frequency modulation continuous wave (FMCW) intermediate frequency (IF) circuitry 308. A first transmission chain includes the shared circuitry 306 and separate circuitry 310. The separate circuitry 310 includes upconversion circuitry 312 (e.g., a mixer) and transmission circuitry 314. The upconversion circuitry 312 upconverts a shared transmission signal from the FMCW-IF circuitry to a transmission frequency. The transmission circuitry 314 can include filters, phase shifters, amplifiers, circuitry for applying a shaping function, antennas, or any other such elements to support transmission of a mmW radar signal in accordance with aspects described herein. While aspects here are described in the context of FMCW, other radar signals and radar technology can be used in accordance with implementations described herein.

Similar to the first transmission chain, a second transmission chain includes the shared circuitry 306 and separate circuitry 320. The separate circuitry 320 comprises multiple elements including upconversion circuitry 322 and transmission circuitry 324. A third transmission chain includes the shared circuitry 306 and separate circuitry 330. The separate circuitry 330 comprises multiple elements including upconversion circuitry 332 and transmission circuitry 334. The upconversion circuitry 322, 332 upconverts the shared transmission signal from the FMCW-IF circuitry to a transmission frequency. The transmission circuitry 324, 334 can include filters, phase shifters, amplifiers, circuitry for applying a shaping function, antennas, or any other such elements to support transmission of a mmW radar signal in accordance with aspects described herein In some examples, the shared circuitry 306 is configured to provide an FMCW signal at baseband, and the upconversion circuitry 312, 322, 332 is configured to upconvert the baseband FMCW signal directly to a transmission frequency.

The system 300 additionally includes shared phase locked loop (PLL) circuitry 301 having a shared PLL output 301A, with the separate circuitry 310 of the first mmW transmission chain, the separate circuitry 320 of the second mmW transmission chain, and the separate circuitry 330 of the third mmW transmission chain each coupled to the shared PLL output 301A. In the example of FIG. 3, the shared PLL output 301A is coupled to each of the mmW transmission chains via local oscillator (LO) circuitry 303.

The separate circuitry 320 of the second mmW transmission chain is additionally coupled to the shared PLL circuitry 301 via first frequency divider circuitry 329. The first mmW transmission chain and the second mmW transmission chain share the shared mmW transmission signal from the FMCW-IF circuitry 308. The first frequency divider circuitry 329 modifies (e.g., divides) the frequency of the signal from the LO circuitry 303 provided to the upconversion circuitry 322, so that the transmission signal generated by the second mmW transmission chain (e.g., from the shared transmission signal mixed with the LO input to the upconversion circuitry 322) will be different (e.g., have at least one different characteristic) than the transmission signal generated by the first mmW transmission chain (e.g., the shared transmission signal mixed with the LO signal input to the upconversion circuitry 312). As described herein, divider circuitry such as the first frequency divider circuitry 329 can be programmable divider circuitry. Alternatively, divider circuitry can be fixed in accordance with a particular application of a particular design. For example, divider circuitry for one path can be fixed at different values from divider circuitry of another path (e.g., 2 for a first path (e.g., the first frequency divider circuitry 329) and 3 for a second path (e.g., divider circuitry 339), or 60 for one path and 30 for another path in certain mmW applications). In other aspects, the divider circuitry can be the same for multiple paths, or can be programmably configurable in one or more paths.

FIG. 3 additionally includes the third mmW transmission chain, which is configured to generate an output transmission signal with at least one different characteristic from the first and second transmission chains due to the divider circuitry 339. For example, the shared mmW transmission signal received at the upconversion circuitry 332, when mixed with the LO signal as modified by divider circuitry 339, results in an output transmission signal from the third mmW transmission chain having a different frequency characteristic from the output signals from the first and second mmW transmission chains.

Additionally, as described above, the transmission circuitry 314, 324, and 334 can include circuitry for PN shaping of each corresponding mmW transmission output. Such PN shaping, along with the frequency modification, can generate signals in a shared direction that can be separated by processing circuitry of a receiver when return pulses from the transmission outputs are received as a single signal (e.g., on a single shared receive antenna).

The three mmW transmission channels of FIG. 3 can be used to generate transmission signals (e.g., signals 232, 242, 252 of FIG. 2). In some aspects, all signals from the three channels have a shared direction. In other aspects, the signals can have different associated directions, with additional characteristics used to distinguish when return signals from transmissions on different directions are detected by the same receiver. In some aspects, additional copies of separate circuitry 310, 320, and 330 can be added to provide transmission outputs for different directions (e.g., the transmission directions 231, 241, 251, or a direction orthogonal to the plane of the wireless device 200, such as into or out of the page so as to travel away from a back cover or screen of the wireless device 200). For example, nine transmission channels could be used, with three channels providing signals for each direction of the transmission directions 231, 241, and 251 of FIG. 2. In some aspects, each grouping of three channels can have separate FMCW-IF circuitry 308, PLL circuitry 301, and LO circuitry 303. In other aspects, all 9 transmission channels can share the same FMCW-IF circuitry 308. Similarly, in some aspects, one transmission chain for each transmission direction can share divider circuitry 329, and one transmission chain for each transmission direction can share divider circuitry 339.

As described in further detail below an RF chain can include a distributed amplifier coupled to a Tx antenna. LO circuitry, and a Rx low noise amplifier coupled to an Rx antenna. In some aspects, aspects, intermediate frequency (IF) signals can be shared as common signals (e.g., to other circuitry in a transceiver chip), and different chains can be distributed in particular RF transceivers of a common chip or across chips, e.g., in respective ICs or chips, for example as may be implemented in the respective subsystems 230, 240, 250. In some aspects, shared PLL and/or LO circuitry can be used in each particular RF transceiver. In some aspects with common circuitry across multiple integrated circuit chips, the PLL and/or LO circuitry can be shared either in an IF transceiver or routed from the transceiver chip including the RF chain to other transceivers (e.g., chips or ICs) similar to a clock signal (e.g., with routing from one RF transceiver to other RF transceiver(s)).

As described above, such combinations of elements allows for reduced power dissipation, while the different mmW transmission chains provide different combinations of transmission characteristics (e.g., direction, frequency, PN envelope, etc.). The provided combination can allow for sophisticated radar systems with multiple simultaneous transmission pulses and efficient receive sensing, where the return signals can be matched with transmission signals based on the characteristics of the transmission signal to minimize cross coupling and make the signals easy to separate. Examples are provided above and in certain examples below for mmW transmission chains, but one or more of the transmission chains may be configured for another frequency, e.g., sub-THz, FR3, sub 6 GHz, etc. Further, while examples are provided herein of transmit circuitry, similar configurations may be implemented for receive circuitry, for example by replacing an amplifier used for transmission with an amplifier used for reception and reversing the flow of the radar signal.

Figure 4:
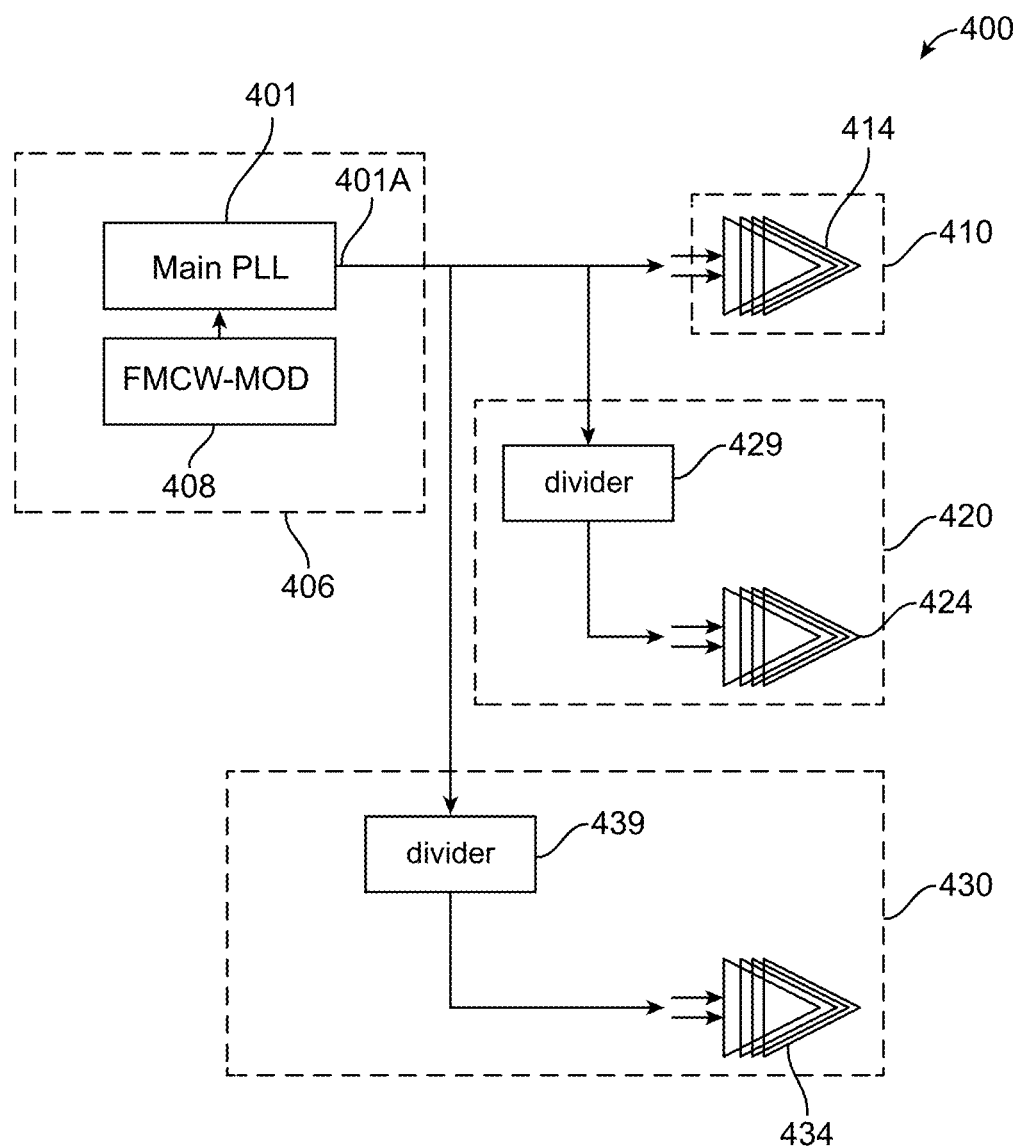
FIG. 4 is a schematic illustrating elements of one implementation of a system with multiple transmission chains supported by shared PLL circuitry in accordance with aspects described herein.

FIG. 4 is a schematic illustrating elements of one implementation of a system 400 with multiple transmission chains supported by shared PLL circuitry 401 in accordance with aspects described herein. Similar to the system 300, the system 400 has three mmW transmission chains, each having shared circuitry 406. The shared circuitry 406, however, is different from the shared circuitry 306, with a FMCW modulation (FMCW-MOD) circuitry 408 providing an input to PLL circuitry 401, such that a shared PLL output 401A provides a shared transmission frequency signal (e.g., rather than the shared IF signal of FIG. 3 which is upconverted by separate upconversion circuitry, and intervening LO circuitry between the shared PLL circuitry and the separate circuitry of each chain).

The separate circuitry 410 of the first mmW transmission chain receives the shared transmission signal directly, and uses first transmission circuitry 414 to output a first mmW transmission. The second mmW transmission chain has separate circuitry 420 which includes division circuitry 429 and transmission circuitry 424. In some aspects, the division circuitry 429 can be configured with the separate circuitry 410, and in other aspects, the division circuitry 429 can be separated as a design choice (e.g., to keep the division circuitry 429 or similar circuitry in close proximity to upconverters). Rather than using an adjusted LO when upconverting to create a second output signal having a different frequency than the first output signal of the first mmW transmission chain, the dividing circuitry 429 modifies the frequency of the transmission signal for the second mmW transmission chain directly. In other aspects, a split output can be used. Similarly, a third mmW transmission chain includes separate circuitry 430 with division circuitry 439 and transmission circuitry 434. As described above, the system 400 is able to generate output transmissions from the different mmW transmission chains having different frequency characteristics. Additionally, as described above, the transmission circuitry 414, 424, 434 can provide additional differentiating characteristics for the different output transmissions, such as PN chirp modulation, and/or can be configured similar to the transmission circuitry 314, 324, 334. Also, as above, additional mmW transmissions can be configured for a device, by duplicating some or all of the elements of the illustrated mmW transmission chains. The division circuitry 429, 439 can be programmable divider circuitry, or can be fixed. For example, the division circuitry 429 can be configured to divide by 2 and the division circuitry 439 can be configured to divide by 3.

Figure 5:
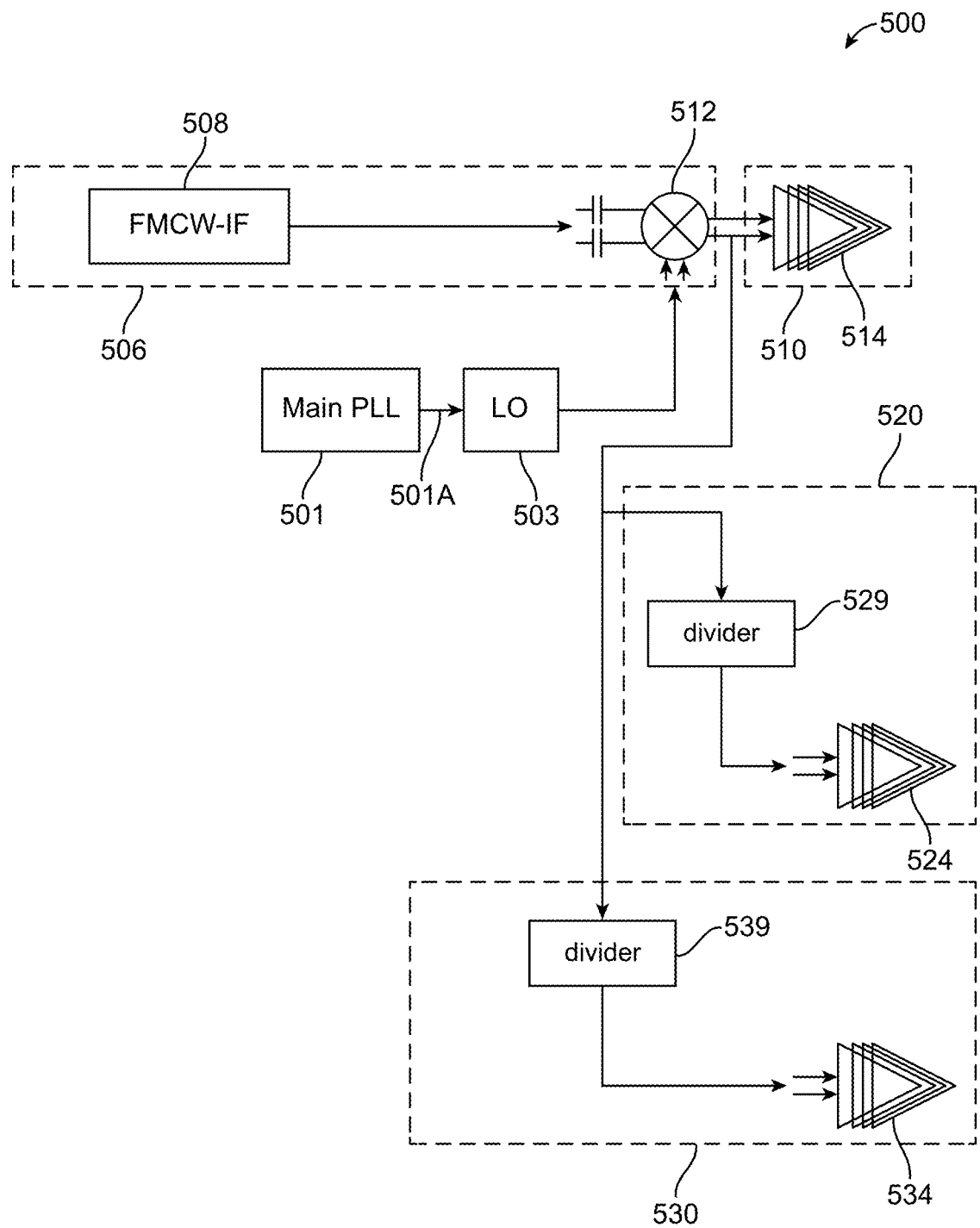
FIG. 5 is a schematic illustrating elements of one implementation of a system with multiple transmission chains supported by shared PLL circuitry in accordance with aspects described herein.

FIG. 5 is a schematic illustrating elements of one implementation of a system 500 with multiple transmission chains supported by shared PLL circuitry 501 in accordance with aspects described herein. System 500 can be considered an intermediate architecture between the architectures of FIGS. 3 and 4. Similar to systems 300 and 400, three mmW transmission chains are presented in the system 500, with each mmW transmission chain including shared circuitry 506. The shared circuitry 506, however, includes both FMCW-IF circuitry 508 (e.g., similar to the FMCW-IF circuitry 308 of FIG. 3) as well as shared upconversion circuitry 512 (e.g., a shared mixer). A shared IF signal is output from the FMCW-IF circuitry and input to the shared upconversion circuitry 512. Also similar to the system 300, shared PLL circuitry 501 has a shared PLL output 501A which supports shared LO circuitry 503. A transmission frequency signal is generated by mixing the IF signal from the FMCW-IF circuitry 508 with the LO signal from the LO circuitry 503 at the upconversion circuitry 512. The transmission frequency signal is output from the upconversion circuitry 512 to the separate circuitry 510, 520, and 530 of the three different mmW transmission chains.

Similar to system 400, the variation in output transmission frequencies is provided by divider circuitry. Divider circuitry 529 of the second mmW transmission chain provides an adjusted transmission signal to the transmission circuitry 524 of the separate circuitry 520. Divider circuitry 539 of the third mmW transmission chain provides an adjusted transmission signal to the transmission circuitry 534 of the separate circuitry 530. Transmission circuitry 514, 524, and 534 then generate output transmissions having different frequency characteristics. The transmission circuitry 514, 524, 534 can be configured similar to the transmission circuitry 314, 324, 334. As described above, additional differentiating characteristics can be applied depending on the configuration of the radar system to allow efficient receive processing of return signals, with the transmission characteristics used for source separation in processing the simultaneous return signals from multiple mmW transmission chains at a receiver. The divider circuitry 529, 539 can be programmable divider circuitry, or can be fixed. For example, the divider circuitry 529 can be a first programmable divider and the divider circuitry 539 can be a second programmable divider, which may be set to the same or a different value, or may be a divider with a fixed divide ratio.

Figure 6:
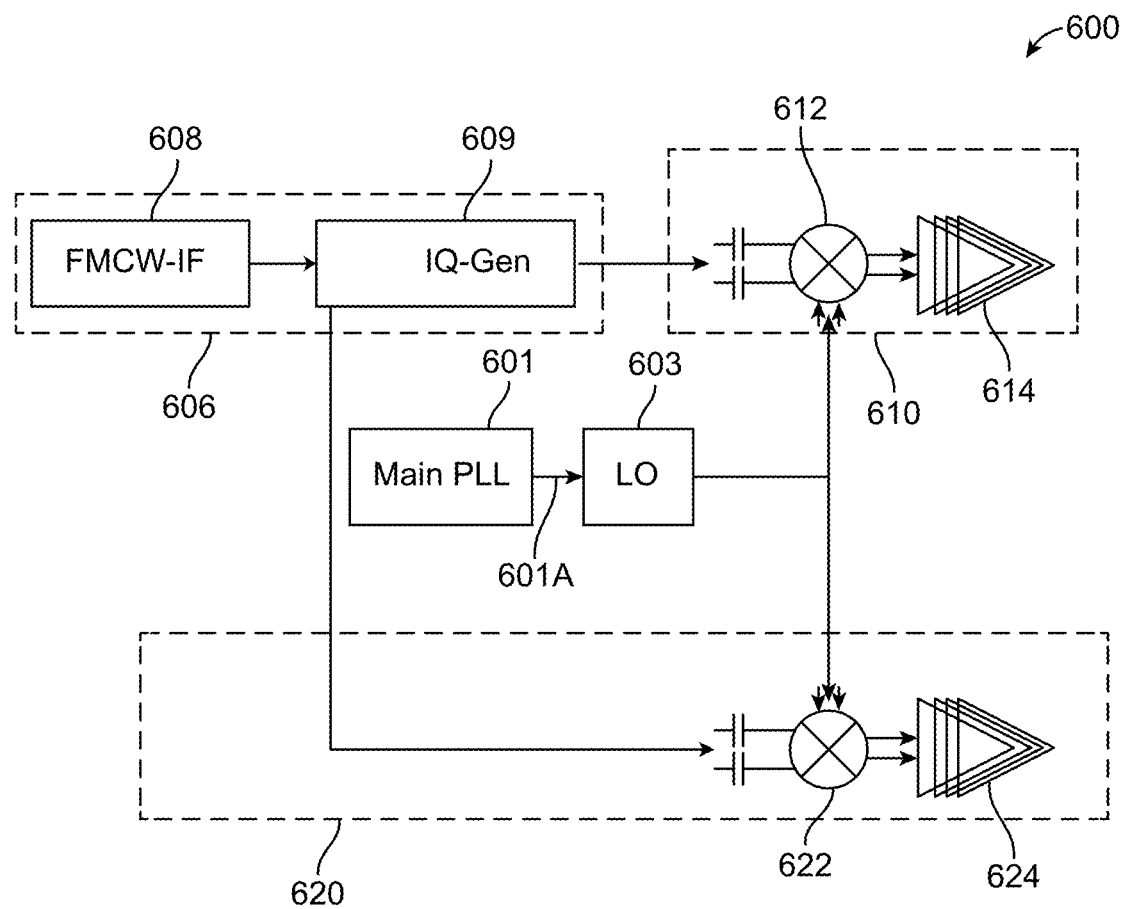
FIG. 6 is a schematic illustrating elements of one implementation of a system with multiple transmission chains supported by shared PLL circuitry in accordance with aspects described herein.

FIG. 6 is a schematic illustrating elements of one implementation of a system 600 with multiple transmission chains supported by shared PLL circuitry 601 in accordance with aspects described herein. System 600 illustrates two separate mmW transmission chains. In the system 600, the two separate mmW transmission chains have different IQ characteristics, rather than adjusted frequency characteristics as in systems 300, 400, 500 above.

In the system 600, a first mmW transmission chain includes shared circuitry 606, which includes FMCW-IF circuitry 608 and IQ generation circuitry 609. The IQ generation circuitry provides a separate IQ transmission signal to the separate circuitry 610 of the first mmW transmission chain. The second mmW transmission chain includes the shared circuitry 606, and the separate circuitry 620. The second mmW transmission chain receives the alternate signal from the IQ generation circuitry 609. Shared PLL circuitry 601 with a shared PLL output 601A drives LO circuitry 603, which provides a shared LO signal to upconversion circuitry of the two different mmW transmission chains. Upconversion circuitry 612 of the first mmW transmission chain receives the shared LO signal from the LO circuitry 603 and a separate signal from the IQ generation circuitry 609 to generate an output signal for the transmission circuitry 614. Upconversion circuitry 622 of the second mmW transmission chain receives the shared LO signal from the LO circuitry 603 and a separate signal from the IQ generation circuitry 609 to generate an output signal for the transmission circuitry 624. The separate portions of the IQ output provide the different characteristic for the transmission signals that can be identified if return signals are received simultaneously in a receiver as described above. The transmission circuitry 614, 624 can be configured similar to the transmission circuitry 314, 324.

Additionally, while the system 600 is shown as separate from the systems 300, 400, and 500, the frequency adjustments for different mmW transmission chains of systems 300, 400, or 500 can be combined with the IQ separation system 600 to provide additional characteristics for different mmW transmission chains in a single device. For example, two additional transmission chains could be added to FIG. 6, with the shared circuitry 606 coupled to third and fourth mmW transmission chains, and the same PLL circuitry 601 and LO circuitry 603 used as well, but with divider circuitry added between the LO circuitry 603 and upconversion circuitry of the third and fourth mmW transmission chains. Each of the third and fourth transmission chains could share an output of the IQ generation circuitry 609 with another chain, or separate outputs from the IQ generation circuitry 609 could be coupled to every chain. Such an architecture provides distinguishing characteristics for each transmission chain such that return signals captured in a single simultaneous receiver signal can be separated by processing based on the transmission characteristics of the different mmW transmission chains.

Figure 7:
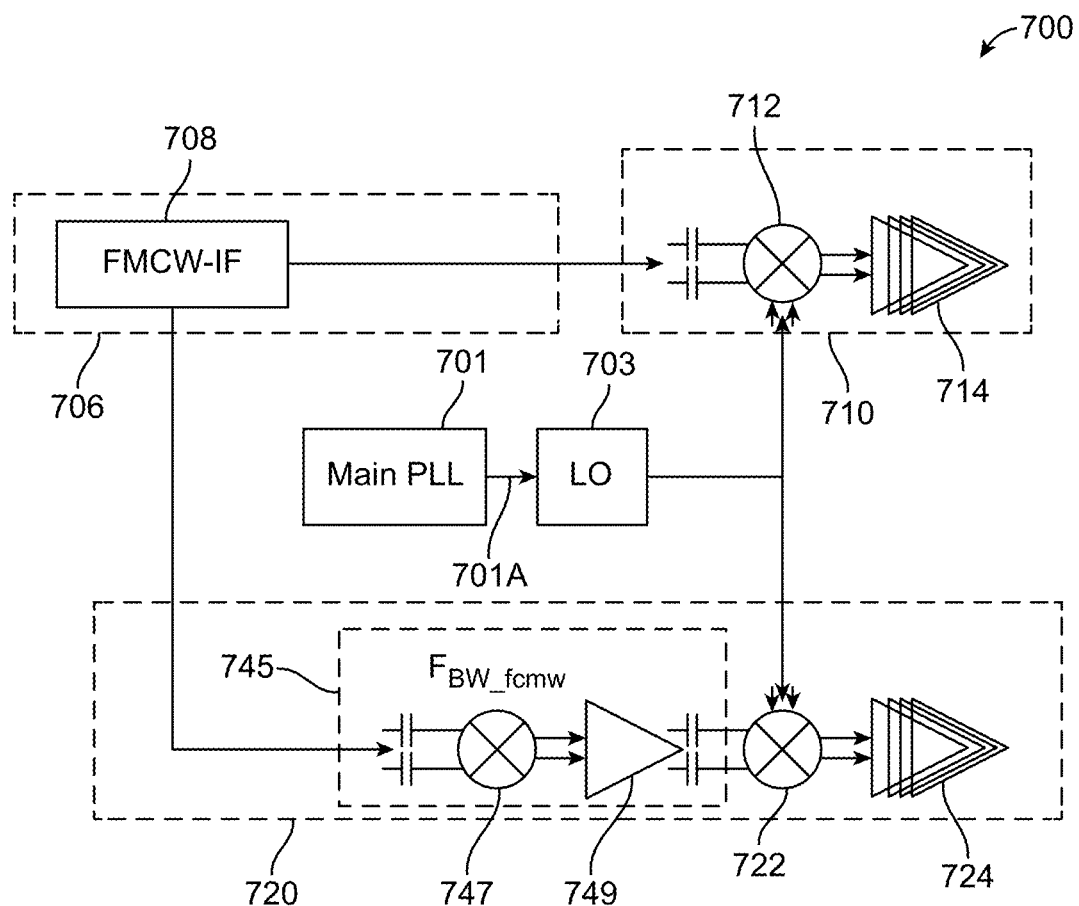
FIG. 7 is a schematic illustrating elements of one implementation of a system with multiple transmission chains supported by shared PLL circuitry in accordance with aspects described herein.

FIG. 7 is a schematic illustrating elements of one implementation of a system 700 with multiple transmission chains supported by shared PLL circuitry 701 in accordance with aspects described herein. Just as with the system 600, the system 700 provides an additional mechanism for providing distinguishing characteristics for mmW transmission chains in a system.

In FIG. 7, shared circuitry 706 includes FMCW-IF circuitry 708, and separate circuitry 710 of the first mmW transmission channel includes upconversion circuitry 712 and transmission circuitry 714. Shared PLL circuitry 701 with a shared PLL output 701A is used in the system 700 with shared LO circuitry 703. The second mmW transmission chain also includes separate circuitry 720 having upconversion circuitry 722 and transmission circuitry 724. The separate circuitry 720 of the second mmW transmission chain, however, includes frequency offset circuitry 745. The frequency offset circuitry 745 includes a mixer 747 and an amplifier 749 which can be used to provide shifted frequency characteristics of transmission signals in the second mmW transmission chain, and to adjust the associated frequency characteristic of the transmission signal output from the second mmW transmission signal. In the example illustrated in FIG. 7, the circuitry 745 is configured to shift the frequency of the signal in the second mmW transmission chain by an amount equal to a bandwidth of the FMCW signal. Other configurations may also be implemented, for example to shift the frequency of the signal in the second mmW transmission chain by a greater amount. In some implementations, the frequency offset circuitry can be used for interference reduction to specifically target particular interference in a design and to achieve a reduction in errors and improve performance. Just as described above for the system 600, the frequency offset circuitry 745 can be combined with elements of any other system described herein to provide different transmission characteristics that can be identified when a receiver processes return signals. The transmission circuitry 714, 724 can be configured similar to the transmission circuitry 314, 324. In the examples in FIGS. 3 and 7, the IF circuitry 308, 708 may be configured to provide (FMCW) radar signals at two outputs, or a shared output may be split into two signals.

Figure 8A:
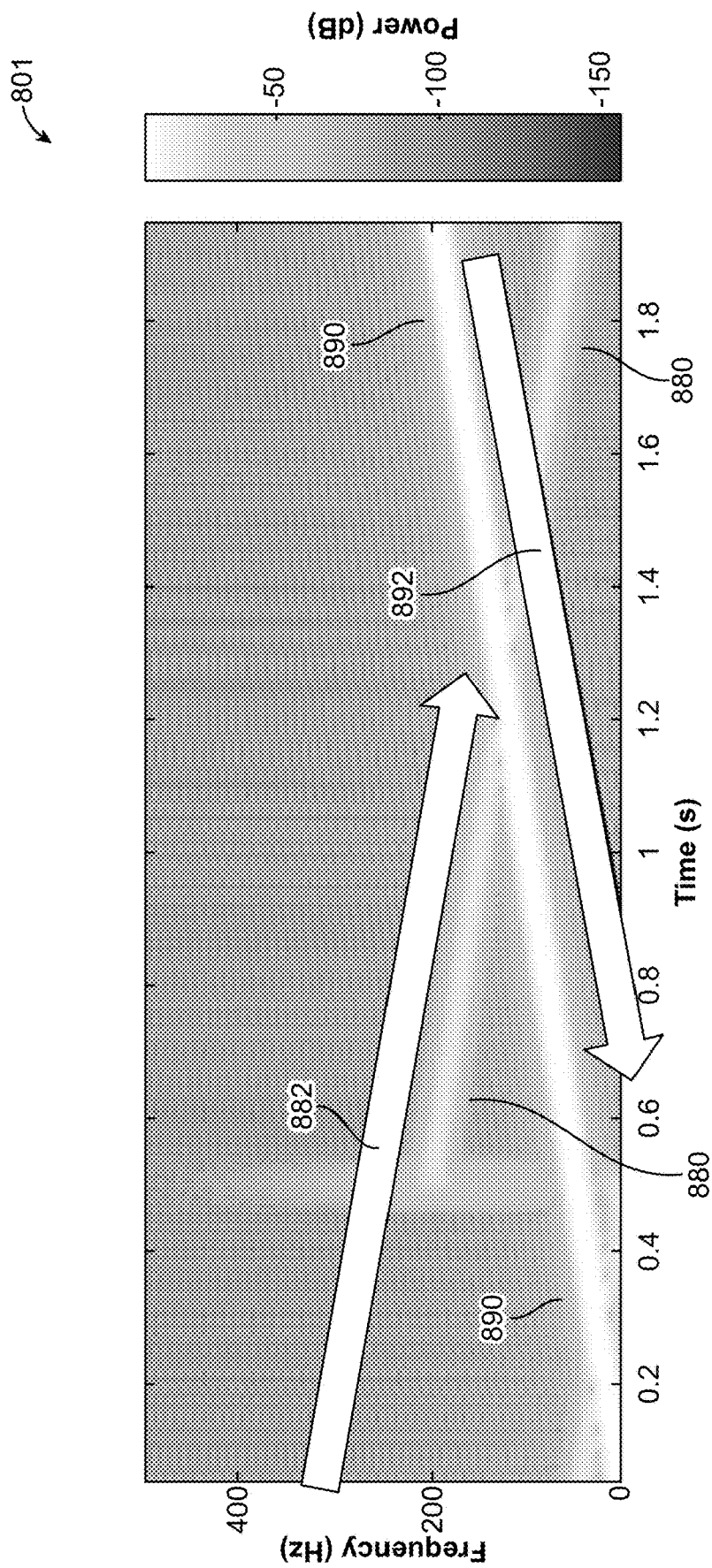
FIG. 8A illustrates details of orthogonal radar signals received by a device in accordance with aspects described herein.

FIG. 8A includes a chart 801 that illustrates details of orthogonal radar signals received by a device in accordance with aspects described herein. The chart 801 illustrates aspects of a signal at a receiver when multiple return signals from simultaneous transmissions are sensed. The example of chart 801 illustrates details of a system operating with a resolution frequency value of approximately 14.68 hertz (Hz) and a time resolution value of 100 milliseconds (ms). The chart 801 illustrates a received power over time. Within the received data shown in the chart 801, a return signal from a first transmission 880 and a return signal from a second transmission 890 can be identified. The return signal from the first transmission 880 has a downward sloping characteristic 882 over the identified time, and the return signal from the second transmission 890 has an upward sloping characteristic 892 over the same time period. Such a characteristic can be identified by processing at a receiver to match return signals from a specific mmW transmission chain. Additionally, in some aspects, such a slope-direction can be used by a trained source separation machine learning system using a machine learning algorithm to identify separate return signals. Such a slope-direction characteristic can be used by a machine learning algorithm in addition to other characteristics, such as a signal level (e.g., power level), a signal index, and a signal frequency domain. In some aspects, the two different signals are generated by different sources in order to run detection in parallel. The sources are configured differently (e.g., one ascending, and one descending), and the ramping up and down characteristics of the two transmission signals are reflected in the return signals, and assist with separation of the return signals.

Figure 8B:
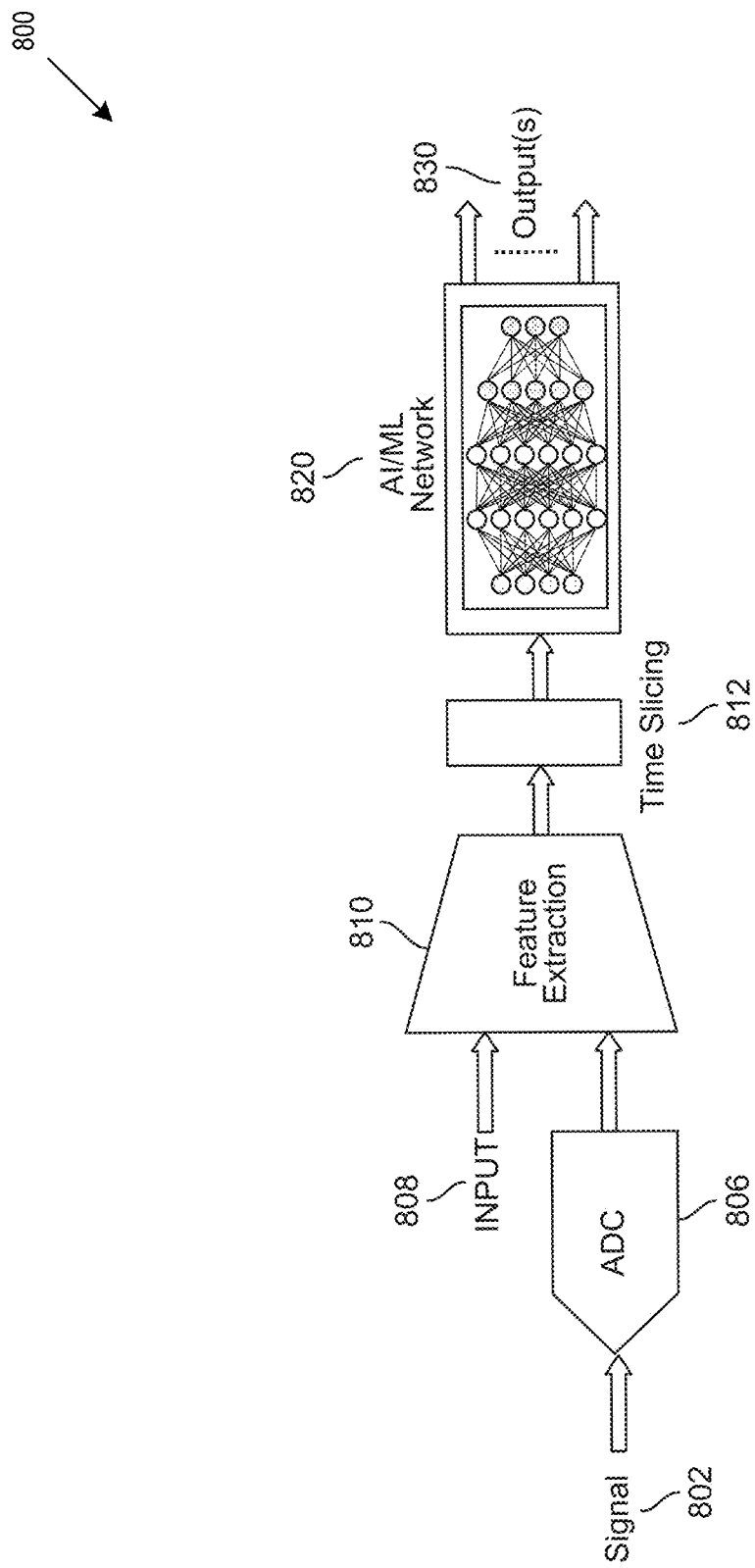
FIG. 8B illustrates details of a system for separating orthogonal radar signals in accordance with aspects described herein.

FIG. 8B illustrates details of a system 800 for separating orthogonal radar signals in accordance with aspects described herein, and machine learning circuitry for use in a receiver in accordance with aspects described herein. The signal 802 can be a return signal received at a receive system of an individual subsystem (e.g., the subsystem 230, 240, 250) from radar transmissions (e.g., including both the return signal from the first transmission 880 and the return signal from the second transmission 890). In some aspects, the signal 802 is a downconverted signal generated from a transmission frequency (e.g., mmW, sub-6 GHz, etc.) signal. The analog to digital converter circuitry 806 provides a digital signal to feature extraction circuitry 810 along with any other inputs 808. The other inputs 808 can be control inputs configured to identify or select features to be extracted from the digital version of the signal 802 output from the ADC 806. In some aspects, the other inputs can be sensors signals such as angle of arrival (AoA) or angle of departure (AoD), acceleration signals, velocity signals, signal levels, slope-direction of chip signals from a Tx path, a module-id signal, etc. Time slicing circuitry 812 divides the information from signals 802 and input 808 into dynamic time slices, and uses that information to create discrete inputs to a machine learning network 820 (e.g., which can use a trained machine-learning algorithm to identify portions of a signal originating from different mmW transmission chains having different characteristics), which provides output(s) 830. Other strategies for separating received (e.g., reflected) radar signals, for example that do not require machine learning, may be implemented additionally or in the alternative.

The ADC circuitry 806 can be used to manage data bandwidths to align incoming data with an operating rate for the network 820. The feature extraction circuitry 810 can then accept state tracking data which is matched using time slicing circuitry 812 to the operating rate of the network 820. The paced state tracking data is then provided to the network 820 for a machine learning analysis of and control selection for a given time slice operation of a return signal that can include radar reflections from multiple radar transmission. The network 820 can be trained or calibrated using data targeted to generate control signals at the output 830 to track expected signals based on the characteristics and PN shaping of the transmission signals. Control signals generated by the outputs 830 can be targeted to a system application, such as object or obstacle detection, channel estimation for wireless communications, map generation, smart transmission, vehicle radar, gesture detection, etc.

Figure 9:
FIG. 9 is a flow diagram illustrating aspects of a method for generating orthogonal transmission signals in accordance with aspects described herein.

FIG. 9 is a flow diagram describing an example of the operation of a method 900 for operation of a device including one or more radar subsystems with multiple transmission chains having shared elements in accordance with aspects described herein. The blocks in the method 900 can be performed in or out of the order shown, and in some embodiments, can be performed at least in part in parallel.

The method 900 includes the block 902, which describes generating a first radar signal using radar signal generation circuitry and a first transmission chain coupled to shared PLL circuitry.

The method 900 also includes the block 904, which describes generating a second radar signal using the radar signal generation circuitry and a second transmission chain coupled to the shared PLL circuitry.

Some implementations of the method 900 can include additional steps, intervening steps, and/or repeated steps. For example, in some aspects, the method 900 further includes receiving a first return radar signal and a second return radar signal as a joint receive signal on a receive path, and performing source separation on the joint receive signal using a trained source separation machine learning algorithm to identify and separate the separate return signals into the first return radar signal associated with the first radar signal and the second return radar signal associated with the second radar signal. Other aspects of such an implementation of the method 900 operate where the trained source separation machine learning algorithm identifies the separate return signals using one or more of a signal level, a signal index, a signal slope-direction, and a signal frequency domain.

Further operations of the method 900 can include operations in accordance with any information provided herein associated with a shared PLL for a wireless communication apparatus.

Figure 10:
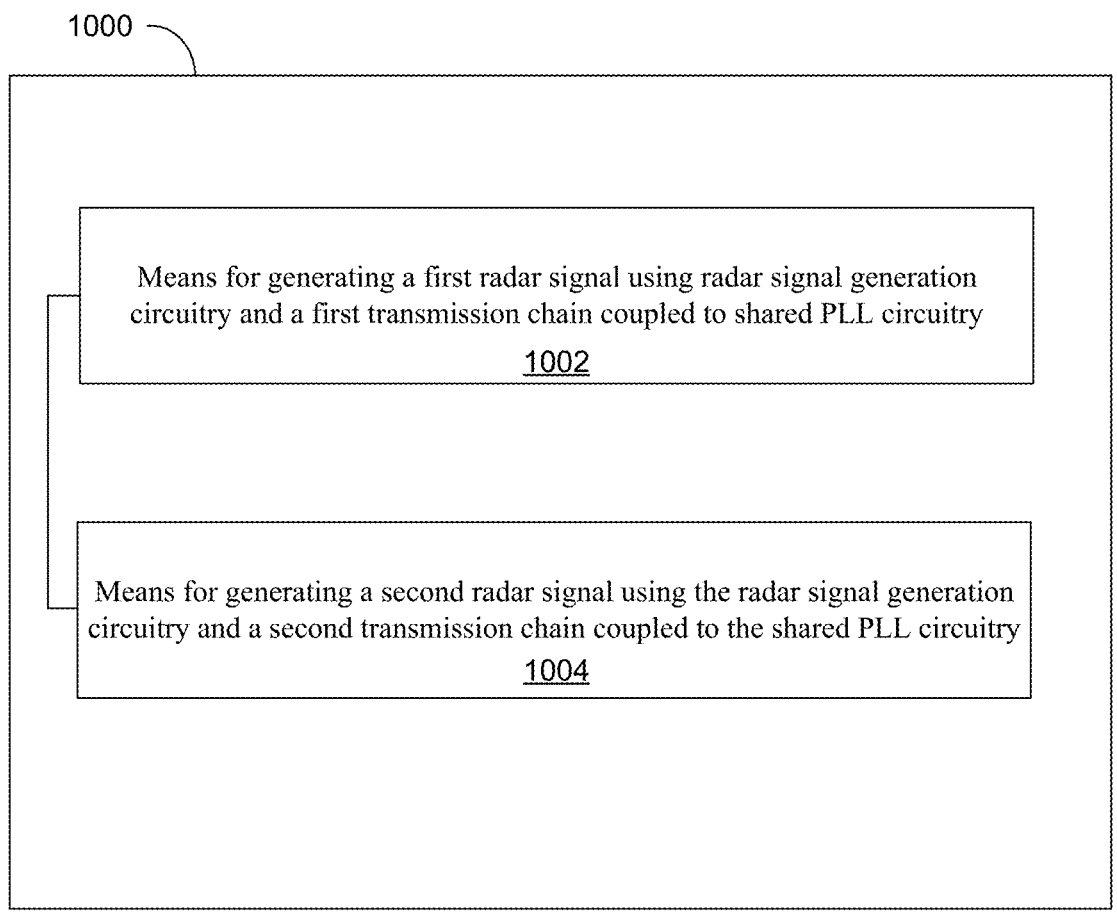
FIG. 10 is a functional block diagram of an apparatus including multiple transmission chains with shared PLL circuitry in accordance with some aspects of the present disclosure.

FIG. 10 is a functional block diagram of an apparatus 1000 including an architecture for transmission of multiple radar signals using transmission chains with shared elements. The apparatus 1000 comprises means 1002 for generating a first radar signal using radar signal generation circuitry and a first transmission chain coupled to shared PLL circuitry, and means 1004 for generating a second radar signal using the radar signal generation circuitry and a second transmission chain coupled to the shared PLL circuitry.

FIG. 11 is a diagram illustrating an exemplary environment 1100 that includes an electronic device 1102 and a base station 1104. The electronic device can include a transceiver (e.g., wireless transceiver 1122 of the electronic device 1102) having multiple transmission chains with shared elements, in accordance with examples described herein. In some aspects, any element of a system such as the system in the environment 1100 can include a transceiver in accordance with aspects described herein. In the environment 1100, the electronic device 1102 communicates with a base station 1104 through a wireless communication link 1106 (wireless link 1106). In such an example, the electronic device 1102 is depicted as a smart phone. However, the electronic device 1102 may be implemented as any suitable computing or other electronic device, such as a cellular base station, broadband router, access point, cellular or mobile phone, gaming device, navigation device, media device, laptop computer, desktop computer, tablet computer, server, network-attached storage (NAS) device, smart appliance, vehicle-based communication system, Internet-of-Things (IoT) device, and so forth.

The base station 1104 communicates with the electronic device 1102 via the wireless link 1106, which may be implemented as any suitable type of wireless link. Although depicted as a base station tower of a cellular radio network, the base station 1104 may represent or be implemented as another device, such as a satellite, cable television head-end, terrestrial television broadcast tower, access point, peer-to-peer device, mesh network node, router, fiber optic line, another electronic device generally, and so forth. Hence, the electronic device 1102 may communicate with the base station 1104 or another device via a wired connection, a wireless connection, or a combination thereof.

The wireless link 1106 can include a downlink of data or control information communicated from the base station 1104 to the electronic device 1102 and an uplink of other data or control information communicated from the electronic device 1102 to the base station 1104. The wireless link 1106 may be implemented using any suitable communication protocol or standard, such as 3rd Generation Partnership Project Long-Term Evolution (3GPP LTE), 5G New Radio (3GPP 5GNR), IEEE 802.11. IEEE 802.16, Bluetooth™, and so forth.

The electronic device 1102 includes a processor 1108 and a computer-readable storage medium 1110 (CRM 1110). The processor 1108 may include any type of processor, such as an application processor or a multi-core processor, that is configured to execute processor-executable instructions (e.g., code) stored by the CRM 1110. The CRM 1110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 1110 is implemented to store instructions 1112, data 1114, and other information of the electronic device 1102, and thus does not include transitory propagating signals or carrier waves.

The electronic device 1102 may also include input/output ports 1116 (I/O ports 1116) or a display 1118. The I/O ports 1116 enable data exchanges or interaction with other devices, networks, or users. The I/O ports 1116 may include serial ports (e.g., universal serial bus (USB) ports), parallel ports, audio ports, infrared (IR) ports, and so forth. The display 1118 can be realized as a screen or projection that presents graphics, e.g.—one or more graphical images, of the electronic device 1102, such as for a user interface associated with an operating system, program, or application. Alternatively, or additionally, the display 1118 may be implemented as a display port or virtual interface through which graphical content of the electronic device 1102 is communicated or presented.

For communication purposes, the electronic device 1102 also includes a modem 1120, a wireless transceiver 1122, and at least one an antenna 1130. The wireless transceiver 1122 includes a subsystem 1124 with a shared PLL for multiple transmission chains in accordance with aspects described herein. In the Example of FIG. 11, the PLL is inside the module or subsystem or IC. In other aspects, the PLL can be shared by chains of a single module, subsystem, or IC, or can be chained between different ICs, for example as described with respect to FIG. 13B. Such transmission chains may be used to transmit radar signals and/or communication signals. In some examples, communication signals are processed by a portion of the transceiver 1122 that is not within the subsystem 1124 or that is shared with the subsystem 1124 without having all of the functionality of the shared PLL systems described above. The wireless transceiver 1122 provides connectivity to respective networks and other electronic devices connected therewith using RF wireless signals. Additionally, or alternatively, the electronic device 1102 may include a wired transceiver, such as an Ethernet or fiber optic interface for communicating over a personal or local network, an intranet, or the Internet. The wireless transceiver 1122 may facilitate communication over any suitable type of wireless network, such as a wireless local area network (LAN) (WLAN) such as Wi-Fi or Bluetooth, a peer-to-peer (P2P) network, a mesh network, a cellular network (e.g., 3GPP2, 4G LTE, 5G NR, or other cellular network), a wireless wide-area-network (WWAN) (e.g., based on 3GPP2, 4G LTE, 5G NR, etc.), a navigational network (e.g., the Global Positioning System (GPS) of North America or another Satellite Positioning System (SPS)), and/or a wireless personal-area-network (WPAN). In the context of the example environment 1100, the wireless transceiver 1122 enables the electronic device 1102 to communicate with the base station 1104 and networks connected therewith. Other figures referenced herein may pertain to other wireless networks.

The modem 1120, such as a baseband modem, may be implemented as a system on-chip (SoC) that provides a digital communication interface for data, voice, messaging, and other applications of the electronic device 1102. Such a modem can, in some aspects, include components described above (e.g., the feature extraction circuitry 810, the AI/ML networks 820, the output(s) 830, etc.). Other implementations can include other elements in accordance with the descriptions provided herein. The modem 1120 may also include baseband circuitry to perform high-rate sampling processes that can include analog-to-digital conversion (ADC), digital-to-analog conversion (DAC), gain correction, skew correction, frequency translation, and so forth. The modem 1120 may also include logic to perform in-phase/quadrature (I/Q) operations, such as synthesis, encoding, modulation, demodulation, and decoding. More generally, the modem 1120 may be realized as a digital signal processor (DSP) or a processor that is configured to perform signal processing to support communications via one or more networks. Alternatively. ADC or DAC operations may be performed by a separate component or another illustrated component, such as the wireless transceiver 1122.

The wireless transceiver 1122 can include circuitry, logic, and other hardware for transmitting or receiving a wireless signal for at least one communication frequency band. In operation, the wireless transceiver 1122 can implement at least one radio-frequency transceiver unit to process data and/or signals associated with communicating data of the electronic device 1102 via the antenna 1130. Generally, the wireless transceiver 1122 can include filters, switches, amplifiers, and so forth for routing and processing signals that are transmitted or received via the antenna 1130. Generally, the wireless transceiver 1122 includes multiple transceiver units (e.g., for different wireless protocols such as WLAN versus WWAN or for supporting different frequency bands or frequency band combinations).

The filters, switches, amplifiers, mixers, and so forth of wireless transceiver 1122 can include, in one example, at least one single-ended amplifier, switch circuitry, at least one transformer, at least one differential amplifier, and at least one mixer. In some implementations, the single-ended amplifier, which amplifies a strength of a signal, is coupled to the antenna 1130. Thus, the single-ended amplifier can couple a wireless signal to or from the antenna 1130 in addition to increasing a strength of the signal. In some implementations, the switch circuitry can switchably couple individual transformers a set of transformers to the single-ended amplifier. The set of transformers provides a physical or electrical separation between the single-ended amplifier and other circuitry of the wireless transceiver 1122. The set of transformers also conditions a signal propagating through the set of transformers. Outputs of a transformer can be coupled to one or more mixers.

Some examples can use a differential amplifier at the output of the transformer before the signal is input to a mixer. In such examples, the differential amplifier, like the single-ended amplifier, reinforces a strength of a propagating signal. The wireless transceiver can further perform frequency conversion using a synthesized signal and the mixer. The mixer may include an upconverter and/or a downconverter that performs frequency conversion in a single conversion step, or through multiple conversion steps. The wireless transceiver 1122 may also include logic (not shown) to perform in-phase/quadrature (V/Q) operations, such as synthesis, encoding, modulation, demodulation, and decoding using a synthesized signal.

In some cases, components of the wireless transceiver 1122, or a transceiver unit thereof, are implemented as separate receiver and transmitter entities. Additionally. or alternatively, the wireless transceiver 1122 can be realized using multiple or different sections to implement respective receiving and transmitting operations (e.g., using separate transmit and receive chains). Example implementations of a transceiver unit are described above. In addition, different wireless protocols such as WWAN and WLAN may be implemented on separate chips or as separate System-on-a-Chips (SoCs). As such, the blocks such as the modem 1120 and transceiver 1122 may represent more than one modem 1120 or transceiver implemented either together on separate chips or separate SoCs.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR) or corresponding mmW elements, (iv) an ASIC such as a mobile station modem (MSM), (v) a module that may be embedded within other devices, (vi) a receiver, cellular phone, wireless device, handset, or mobile unit, (vii) etc.

FIG. 12 is a diagram illustrating an exemplary electronic device 1202, which includes a transceiver 1206 that can include and/or implement multiple transmission chains with shared elements as described herein. As shown, the electronic device 1202 includes an antenna 1204, a transceiver 1206, and a user input/output (I/O) interface 1208, in addition to the integrated circuit 1210. Illustrated examples of the integrated circuit 1210, or cores thereof, include a microprocessor 1212, a graphics processing unit (GPU) 1214, a memory array 1216, and a modem 1218. Each component can be operably coupled to another component, such as the GPU 1214 being operably coupled to the user I/O interface 1208.

The electronic device 1202 can be a mobile or battery-powered device or a fixed device that is designed to be powered by an electrical grid. Examples of the electronic device 1202 include a server computer, a network switch or router, a blade of a data center, a personal computer, a desktop computer, a notebook or laptop computer, a tablet computer, a smart phone, an entertainment appliance, or a wearable electronic device such as a smartwatch, intelligent glasses, or an article of clothing. An electronic device 1202 can also be a device, or a portion thereof, having embedded electronics. Examples of the electronic device 1202 with embedded electronics include a passenger vehicle, industrial equipment, a refrigerator or other home appliance, a drone or other unmanned aerial vehicle (UAV), or a power tool.

For an electronic device with a wireless capability, the electronic device 1202 includes an antenna 1204 that is coupled to a transceiver 1206 to enable reception or transmission of one or more wireless signals. The integrated circuit 1210 may be coupled to the transceiver 1206 to enable the integrated circuit 1210 to have access to received wireless signals or to provide wireless signals for transmission via the antenna 1204. The electronic device 1202 as shown also includes at least one user I/O interface 1208.

Examples of the user I/O interface 1208 include a keyboard, a mouse, a microphone, a touch-sensitive screen, a camera, an accelerometer, a haptic mechanism, a speaker, a display screen, or a projector.

The integrated circuit 1210 may comprise, for example, one or more instances of a microprocessor 1212, a GPU 1214, a memory array 1216, a modem 1218, and so forth. The microprocessor 1212 may function as a central processing unit (CPU) or other general-purpose processor. Some microprocessors include different parts, such as multiple processing cores, that may be individually powered on or off. The GPU 1214 may be especially adapted to process visual related data for display, such as video data images. If visual-related data is not being rendered or otherwise processed, the GPU 1214 may be fully or partially powered down. The memory array 1216 stores data for the microprocessor 1212 or the GPU 1214. Example types of memory for the memory array 1216 include random access memory (RAM), such as dynamic RAM (DRAM) or static RAM (SRAM); flash memory; and so forth. If programs are not accessing data stored in memory, the memory array 1216 may be powered down overall or block-by-block. The modem 1218 demodulates a signal to extract encoded information or modulates a signal to encode information into the signal. If there is no information to decode from an inbound communication or to encode for an outbound communication, the modem 1218 may be idled to reduce power consumption. The integrated circuit 1210 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1210 may also comprise a system on chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 1210 generally, may be termed cores or circuit blocks. Examples of cores or circuit blocks include, in addition to those that are illustrated in FIG. 12, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Figure 13A:
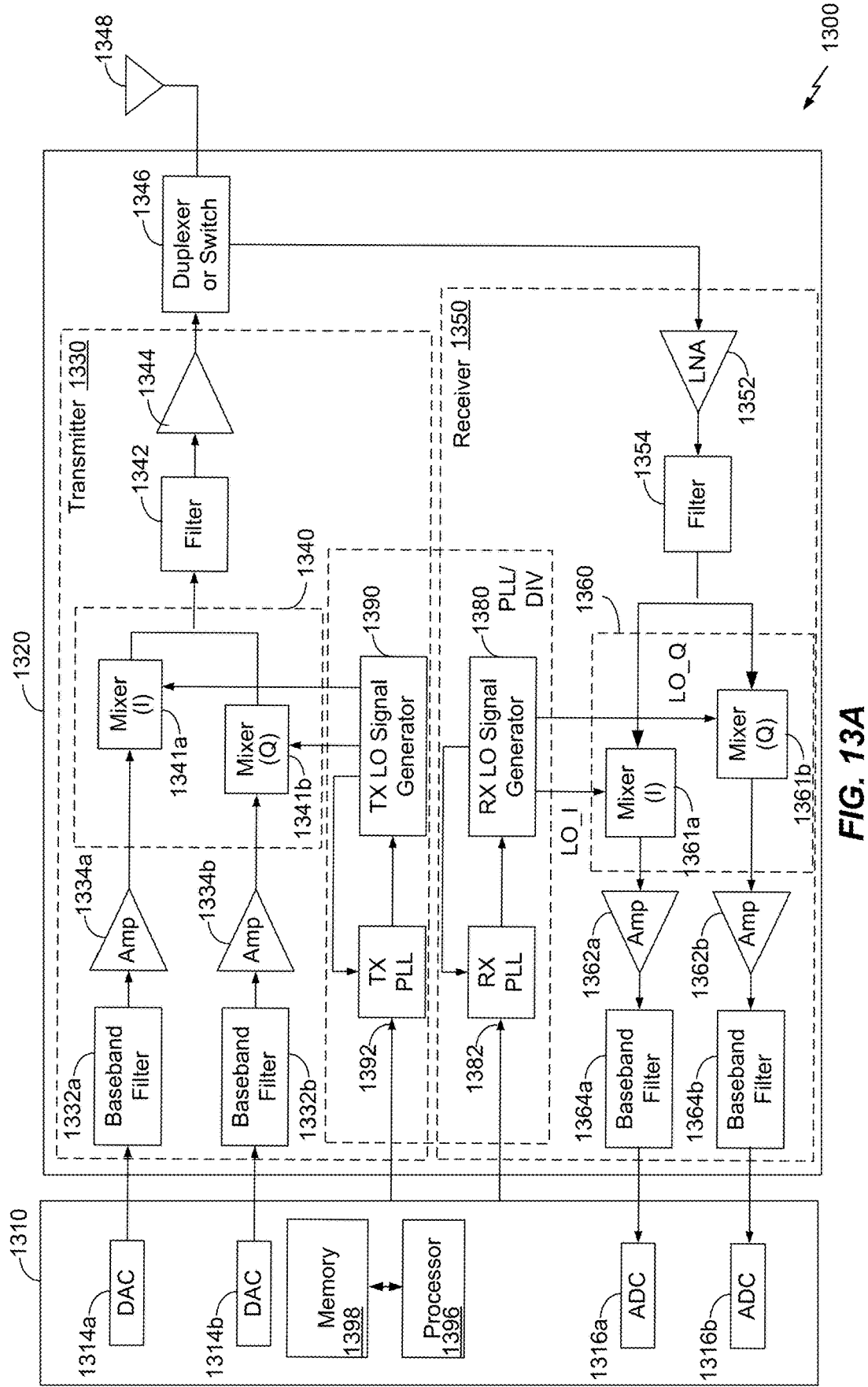
FIG. 13A is a diagram of aspects of an RF front end that can be adapted for use in implementations with shared PLL circuitry for multiple transmission paths in accordance with aspects described herein.

FIG. 13A shows an example of a transceiver 1320 having a transmitter 1330 and a receiver 1350. In accordance with aspects described herein, the transmitter 1330 can include multiple transmission chains (e.g. in addition to the illustrated transmission chain) with individual transmission chains including elements for creating different characteristics as described above. The receiver 1350 can include processing circuitry as illustrated in FIG. 8B for identifying separate return signals from different transmission chains in accordance with aspects described herein. The receiver 1350 can include any Rx chain and can be integrated with various Tx chain systems in the transmitter 1330 in accordance with aspects described herein. Rx and Tx chains can be merged or integrated with AI/ML network(s) 820 in various implementations.

In general, the conditioning of the signals in the transmitter 1330 and the receiver 1350 may be performed by one or more stages of amplifier, filter, upconverter, downconverter, etc. These circuit blocks may be arranged differently from the configuration shown in FIG. 13A. Furthermore, other circuit blocks not shown in FIG. 13A may also be used to condition the signals in the transmitter 1330 and receiver 1350. Unless otherwise noted, any signal in FIG. 13A, or any other figure in the drawings, may be either single-ended or differential. Some circuit blocks in FIG. 13A may also be omitted.

In the example shown in FIG. 13A, wireless device 1300 generally comprises the transceiver 1320 and a data processor 1310. The data processor 1310 may include a processor 1396 operatively coupled to a memory 1398. The memory 1398 may be configured to store data and program codes, and may generally comprise analog and/or digital processing components. The transceiver 1320 includes a transmitter 1330 and a receiver 1350 that support bi-directional communication. In general, wireless device 1300 may include any number of transmitters and/or receivers for any number of communication systems and frequency bands. All or a portion of the transceiver 1320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. Such configuration may be utilized to generate the IF signals described with respect to the examples in FIGS. 3, 5, 6, 7. In the direct-conversion architecture, a signal is frequency converted between RF and baseband in one stage. The super-heterodyne and direct-conversion architectures may use different circuit blocks and/or have different requirements. In the example shown in FIG. 13A, a single frequency converter (1340, 1360) is illustrated for transmit and receive functions, but a series of mixers may be used.

In the transmit path, the data processor 1310 processes data to be transmitted and provides in-phase (I) and quadrature (Q) analog output signals to the transmitter 1330. In an exemplary embodiment, the data processor 1310 includes digital-to-analog-converters (DAC's) 1314*a* and 1314*b* for converting digital signals generated by the data processor 1310 into the I and Q analog output signals. e.g., I and Q output currents, for further processing. In other embodiments, the DACs 1314*a* and 1314*b* are included in the transceiver 1320 and the data processor 1310 provides data (e.g., for I and Q) to the transceiver 1320 digitally.

Within the transmitter 1330, baseband (e.g., lowpass) filters 1332*a* and 1332*b* filter the I and Q analog transmit signals, respectively, to remove undesired images caused by the prior digital-to-analog conversion. Amplifiers (Amp) 1334*a* and 1334*b* amplify the signals from the baseband filters 1332*a* and 1332*b*, respectively, and provide I and Q baseband signals. An upconverter 1340 having upconversion mixers 1341*a* and 1341*b* upconverts the I and Q baseband signals with I and Q transmit (TX) local oscillator (LO) signals from a TX LO signal generator 1390 and provides an upconverted signal. A filter 1342 filters the upconverted signal to remove undesired images caused by the frequency upconversion as well as noise in a receive frequency band. The distributed amplifier 1344 amplifies the signal from filter 1342 to obtain the desired output power level and provides a transmit RF signal. The transmit RF signal is routed through a duplexer or switch 1346 and transmitted via an antennas 1348. While examples discussed herein utilize I and Q signals, those of skill in the art will understand that components of the transceiver may be configured to utilize polar modulation.

In the receive path, the antennas 1348 receives communication signals and provides a received RF signal, which is routed through duplexer or switch 1346 and provided to a low noise amplifier (LNA) 1352. The switch 1346 is designed to operate with a specific RX-to-TX duplexer frequency separation, such that RX signals are isolated from TX signals. The received RF signal is amplified by LNA 1352 and filtered by a filter 1354 to obtain a desired RF input signal. Downconversion mixers 1361*a* and 1361*b* in a downconverter 1360 mix the output of filter 1354 with I and Q receive (RX) LO signals (i.e., LO_I and LO_Q) from an RX LO signal generator 1380 to generate I and Q baseband signals. The I and Q baseband signals are amplified by amplifiers 1362*a* and 1362*b* and further filtered by baseband (e.g., lowpass) filters 1364*a* and 1364*b* to obtain I and Q analog input signals, which are provided to data processor 1310. In the exemplary embodiment shown, the data processor 1310 includes analog-to-digital-converters (ADC's) 1316*a* and 1316*b* for converting the analog input signals into digital signals to be further processed by the data processor 1310. In some embodiments, the ADCs 1316*a* and 1316*b* are included in the transceiver 1320 and provide data to the data processor 1310 digitally.

In FIG. 13A, TX LO signal generator 1390 generates the I and Q TX LO signals used for frequency upconversion, while RX LO signal generator 1380 generates the I and Q RX LO signals used for frequency downconversion. Each LO signal is a periodic signal with a particular fundamental frequency. A phase locked loop (PLL) 1392 receives timing information from data processor 1310 and generates a control signal used to adjust the frequency and/or phase of the TX LO signals from LO signal generator 1390. Similarly, a PLL 1382 receives timing information from data processor 1310 and generates a control signal used to adjust the frequency and/or phase of the RX LO signals from LO signal generator 1380. The PLL 1392 may be selectively coupled to modulation circuitry (e.g., 408) and an input of the distributed amplifier 1344. In other examples, a PLL separate from the PLL 1392 is included in the transmitter 1330 and configured as described with respect to the example in FIG. 4.

Certain components of the transceiver 1320 are functionally illustrated in FIG. 13A, and the configuration illustrated therein may or may not be representative of a physical device configuration in certain implementations. For example, as described above, transceiver 1320 may be implemented in various integrated circuits (ICs), RF ICs (RFICs), mixed-signal ICs, etc. In some embodiments, the transceiver 1320 is implemented on a substrate or board such as a printed circuit board (PCB) having various modules, chips, and/or components. For example, the distributed amplifier 1344, the filter 1342, and the switch 1346 may be implemented in separate modules or as discrete components, while the remaining components illustrated in the transceiver 1320 may be implemented in a single transceiver chip.

The distributed amplifier 1344 may comprise one or more stages comprising, for example, driver stages, power amplifier stages, or other components, that can be configured to amplify a communication signal on one or more frequencies, in one or more frequency bands, and at one or more power levels. Depending on various factors, the distributed amplifier 1344 can be configured to operate using one or more driver stages, one or more power amplifier stages, one or more impedance matching networks, and can be configured to provide good linearity, efficiency, or a combination of good linearity and efficiency.

In some aspects using a super-heterodyne architecture, the distributed amplifier 1344, and the LNA 1352 (and filter 1342 and/or 1354 in some examples) may be implemented separately from other components in the transmitter 1330 and receiver 1350. While wireless device 1300 describes one example of a device, it will be apparent that aspects described herein can be implemented in other architectures (e.g., super-heterodyne architectures) power envelope tracking systems described are not limited to power amplifiers in architectures such as the architecture in the example of FIG. 13A.

Figure 13B:
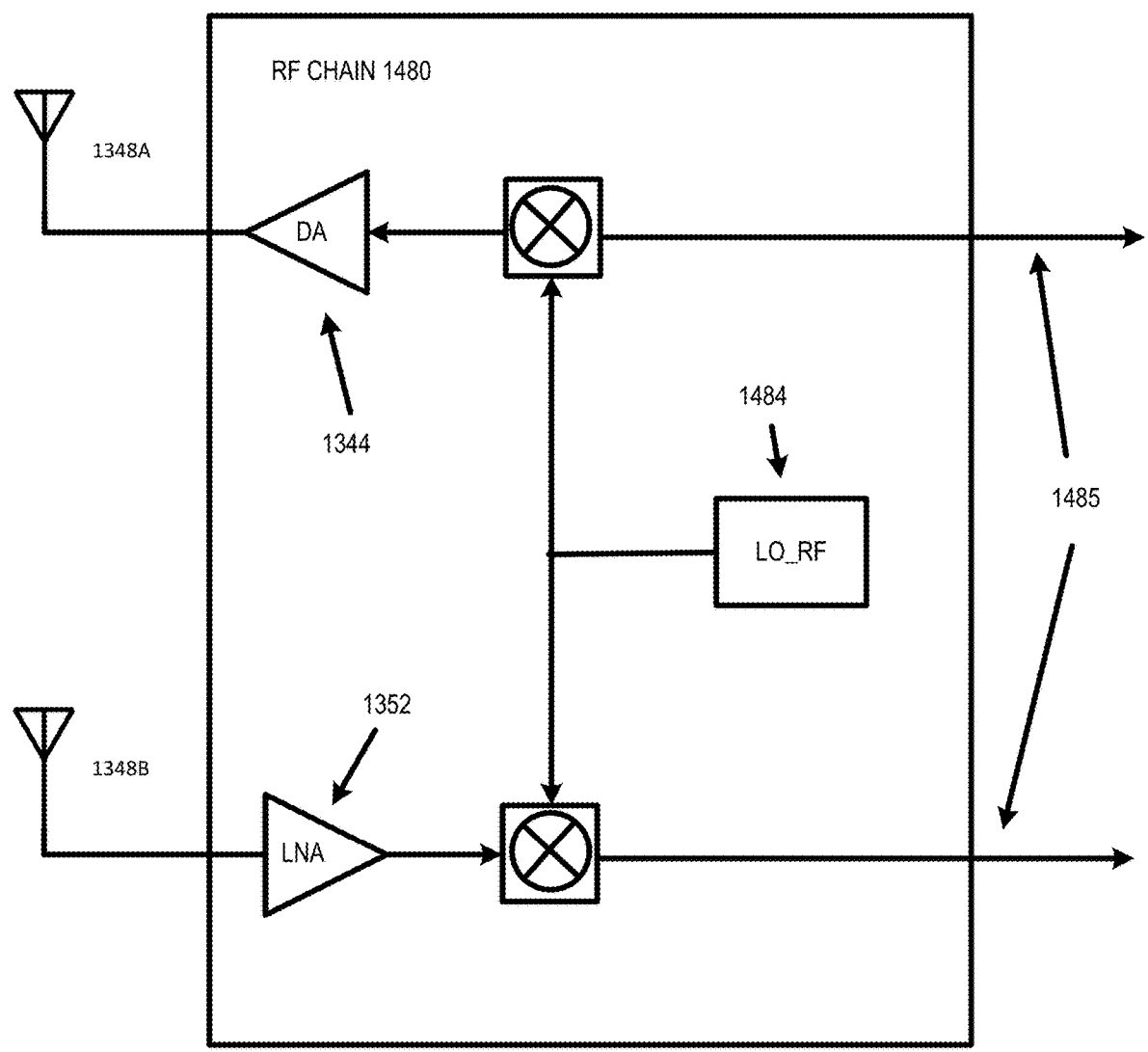
FIG. 13B illustrates elements of an RF chain in accordance with some aspects described herein.

FIG. 13B illustrates an RF chain 1480 that can be implemented in accordance with some aspects. For example, the RF chain 1480 can be positioned between the distributed amplifier 1344, the LNA 1352, and the switch 1346. The Rf chain 1480 is part of an RF transceiver, which generates transmitted signals. As described in FIG. 13B, the Rf chain 1480 can include the LO circuitry 1484, a Tx antenna 1348A, and an Rx antenna 1348B. In some aspects, intermediate frequency (IF) signals 1485 can be shared as common signals (e.g., to other circuitry in a transceiver chip), and different chains (e.g., other than the RF chain 1480) can be distributed in particular RF transceivers (e.g., in different chips or ICs). In some aspects, PLL and/or LO circuitry 1484 can be used in each particular RF transceiver. In some aspects with common circuitry across multiple integrated circuit chips, the PLL and/or LO circuitry 1484 can be shared either in an IF transceiver or routed from the transceiver chip including the RF chain 1480 to other transceivers (e.g., other chips or ICs) similar to a clock signal (e.g., with routing from one RF transceiver to other RF transceiver(s)).

Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, smart glasses, augmented reality (AR) glasses, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, such as a vehicular head unit, avionics systems, a drone, and a multicopter.

Claim language or other language reciting "at least one processor configured to," "at least one processor being configured to," "one or more processors configured to," "one or more processors being configured to," or the like indicates that one processor or multiple processors (in any combination) can perform the associated operation(s). For example, claim language reciting "at least one processor configured to: X, Y, and Z" means a single processor can be used to perform operations X, Y. and Z; or that multiple processors are each tasked with a certain subset of operations X, Y, and Z such that together the multiple processors perform X, Y, and Z; or that a group of multiple processors work together to perform operations X, Y. and Z. In another example, claim language reciting "at least one processor configured to: X, Y, and Z" can mean that any single processor may only perform at least a subset of operations X, Y, and Z.

Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions.

Where reference is made to an entity (e.g., any entity or device described herein) performing functions or being configured to perform functions (e.g., steps of a method), the entity may be configured to cause one or more elements (individually or collectively) to perform the functions. The one or more components of the entity may include at least one memory, at least one processor, at least one communication interface, another component configured to perform one or more (or all) of the functions, and/or any combination thereof. Where reference to the entity performing functions, the entity may be configured to cause one component to perform all functions, or to cause more than one component to collectively perform the functions. When the entity is configured to cause more than one component to collectively perform the functions, each function need not be performed by each of those components (e.g., different functions may be performed by different components) and/or each function need not be performed in whole by only one component (e.g., different components may perform different sub-functions of a function).

Although selected aspects have been illustrated and described in detail, it will be understood that various substitutions and alterations may be made therein without departing from the spirit and scope of the present invention, as defined by the following claims.

Illustrative aspects of the present disclosure include, but are not limited to:

Aspect 1. A apparatus comprising: phase locked loop (PLL) circuitry having a shared PLL output; radar signal generation circuitry; a first transmission chain coupled to the shared PLL output and the radar signal generation circuitry; and a second transmission chain coupled to the shared PLL output and the radar signal generation circuitry.

Aspect 2. The apparatus of Aspect 1, wherein the shared PLL output is coupled to a mixer of the first transmission chain via local oscillator (LO) circuitry.

Aspect 3. The apparatus of Aspect 2, wherein the shared PLL output is coupled to a mixer of the second transmission chain via the LO circuitry and first frequency divider circuitry.

Aspect 4. The apparatus of Aspect 3, further comprising: a third transmission chain coupled to the shared PLL output via the LO circuitry and second frequency divider circuitry separate from the first frequency divider circuitry.

Aspect 5. The apparatus of Aspect 3, wherein the first frequency divider circuitry comprises a programmable divider.

Aspect 6. The apparatus of any of Aspects 1 to 5, wherein the first transmission chain and the second transmission chain comprise the shared PLL output; wherein the PLL circuitry is configured to generate a shared transmission signal using a frequency modulated continuous wave (FMCW) modulation input; wherein transmission circuitry of the second transmission chain is coupled to the shared PLL output via frequency divider circuitry; and wherein transmission circuitry of the first transmission chain is coupled to the shared PLL output.

Aspect 7. The apparatus of Aspect 6, further comprising, a third transmission chain coupled to the shared PLL output via second frequency divider circuitry separate from the first frequency divider circuitry.

Aspect 8. The apparatus of Aspect 6, wherein the transmission circuitry of the first transmission chain is configured to output a first radar transmission at a shared frequency with the shared transmission signal; and wherein the transmission circuitry of the second transmission chain is configured to output a second radar transmission at second frequency shifted from the shared frequency by the frequency divider circuitry.

Aspect 9. The apparatus of any of Aspects 1 to 8, wherein the first transmission chain and the second transmission chain comprise a shared mixer; wherein the shared PLL output is coupled to a LO input of the shared mixer; and wherein transmission circuitry of the second transmission chain is coupled to an output of the shared mixer via frequency divider circuitry.

Aspect 10. The apparatus of Aspect 9, wherein transmission circuitry of the first transmission chain is separate from the transmission circuitry of the second transmission chain and is coupled to the output of the shared mixer without intervening frequency divider circuitry.

Aspect 11. The apparatus of Aspect 9, wherein the radar signal generation circuitry comprises shared frequency modulated continuous wave-intermediate frequency (FMCW-IF) signal generation circuitry coupled to a signal input of the shared mixer.

Aspect 12. The apparatus of any of Aspects 1 to 11, wherein the first transmission chain and the second transmission chain share frequency modulated continuous wave-intermediate frequency (FMCW-IF) circuitry and IQ generation circuitry coupled to the FMCW-IF circuitry; wherein a first output of the IQ generation circuitry is coupled to transmission circuitry of the first transmission chain via a first mixer of the first transmission chain; wherein a second or split output of the IQ generation circuitry is coupled to transmission circuitry of the second transmission chain via a second mixer of the second transmission chain.

Aspect 13. The apparatus of any of Aspects 1 to 12, wherein the apparatus is configured to transmit multiple radar signals concurrently at different respective frequencies via the first transmission chain and the second transmission chain.

Aspect 14. The apparatus of any of Aspects 1 to 13, wherein the first transmission chain and the second transmission share frequency modulated continuous wave-intermediate frequency (FMCW-IF) circuitry.

Aspect 15. The apparatus of Aspect 14, wherein a first output of the FMCW-IF circuitry is coupled to transmission circuitry of the first transmission chain via a first mixer of the first transmission chain; wherein a second or split output of the FMCW-IF circuitry is coupled to transmission circuitry of the second transmission chain via a second mixer of the second transmission chain.

Aspect 16. The apparatus of Aspect 15, wherein the second or split output of the FMCW-IF circuitry is coupled to the second mixer via frequency adjustment circuitry.

Aspect 17. The apparatus of Aspect 16, wherein the frequency adjustment circuitry comprises interference reduction circuitry.

Aspect 18. The apparatus of Aspect 16, wherein the frequency adjustment circuitry comprises frequency offset circuitry.

Aspect 19. The apparatus of any of Aspects 1 to 18, wherein the first transmission chain generates a first signal, and wherein the second transmission chain generates a second signal orthogonal to the first signal.

Aspect 20. The apparatus of Aspect 19, wherein the first signal is a first pseudorandom (PN) shaped signal, and wherein the second signal is a second PN shaped signal orthogonal to the first PN shaped signal.

Aspect 21. The apparatus of any of Aspects 1 to 20, wherein the first transmission chain and the second transmission chain are configured for transmission in a first transmission direction; wherein a chirp pattern for a transmission signal of the first transmission chain is orthogonal to a chirp pattern of a transmission signal of the second transmission chain.

Aspect 22. The apparatus of Aspect 21, wherein a third transmission chain and a fourth transmission chain are configured for transmission in a second transmission direction orthogonal to the first transmission direction; and wherein a chirp pattern for a transmission signal of the third transmission chain is orthogonal to a chirp pattern of a transmission signal of the fourth transmission chain.

Aspect 23. The apparatus of any of Aspects 1 to 22, further comprising a shared receive path; and processing circuitry configured to perform source separation on received signals to identify separate return chirp signals from the first transmission chain and the second transmission chain.

Aspect 24. The apparatus of any of Aspects 1 to 23, wherein the processing circuitry is configured to identify the separate return chirp signals using a trained source separation machine learning algorithm.

Aspect 25. The apparatus of Aspect 24, wherein the trained source separation machine learning algorithm identifies the separate return chirp signals using one or more of a signal level, a signal index, a signal slope-direction, and a signal frequency domain.

Aspect 26. The apparatus of any of Aspects 1 to 25, wherein the first transmission chain is disposed in a first radio frequency front end (RFFE) module; and wherein the second transmission chain is disposed in a second RFFE module.

Aspect 27. The apparatus of Aspect 26, wherein the first RFFE module comprises a first antenna coupled to the first transmission chain, wherein the first antenna covers a first spatial location; wherein the second RFFE module comprises a second antenna coupled to the second transmission chain, wherein the second antenna covers a second spatial location different from the first spatial location.

Aspect 28. A method comprising: generating a first radar signal using radar signal generation circuitry and a first transmission chain coupled to shared PLL circuitry; generating a second radar signal using the radar signal generation circuitry and a second transmission chain coupled to the shared PLL circuitry;

Aspect 29. The method of Aspect 28, further comprising: receiving a first return radar signal and a second return radar signal as a joint receive signal on a receive path; performing source separation on the joint receive signal using a trained source separation machine learning algorithm to identify and separate the separate return signals into the first return radar signal associated with the first radar signal and the second return radar signal associated with the second radar signal.

Aspect 30. The method of any of Aspects 28 to 29, wherein the trained source separation machine learning algorithm identifies the separate return signals using one or more of a signal level, a signal index, a signal slope-direction, and a signal frequency domain.

Aspect 31: An apparatus comprising means for performing operations according to any of aspects 1 through 29 above.

Aspect 32: A non-transitory computer-readable storage medium comprising instructions stored thereon which, w % ben executed by one or more processors, cause the one or more processors to implement operations according to any of aspects 1 through 29 above.

Aspect 33: A method of operating any apparatus according to any aspect above to perform wireless communications with a shared PLL.

What is claimed is:

1. A apparatus comprising:
phase locked loop (PLL) circuitry having a shared PLL output;
radar signal generation circuitry;
a first transmission chain coupled to the shared PLL output and the radar signal generation circuitry; and
a second transmission chain coupled to the shared PLL output and the radar signal generation circuitry.

2. The apparatus of claim 1, wherein the shared PLL output is coupled to a mixer of the first transmission chain via local oscillator (LO) circuitry.

3. The apparatus of claim 2, wherein the shared PLL output is coupled to a mixer of the second transmission chain via the LO circuitry and first frequency divider circuitry.

4. The apparatus of claim 3, further comprising:
a third transmission chain coupled to the shared PLL output via the LO circuitry and second frequency divider circuitry separate from the first frequency divider circuitry.

5. The apparatus of claim 1, wherein the first transmission chain and the second transmission chain comprise the shared PLL output;
wherein the PLL circuitry is configured to generate a shared transmission signal using a frequency modulated continuous wave (FMCW) modulation input;
wherein transmission circuitry of the second transmission chain is coupled to the shared PLL output via frequency divider circuitry; and
wherein transmission circuitry of the first transmission chain is coupled to the shared PLL output.

6. The apparatus of claim 3, further comprising:
a third transmission chain coupled to the shared PLL output via second frequency divider circuitry separate from the first frequency divider circuitry.

7. The apparatus of claim 5, wherein the transmission circuitry of the first transmission chain is configured to output a first radar transmission at a shared frequency with the shared transmission signal; and wherein the transmission circuitry of the second transmission chain is configured to output a second radar transmission at second frequency shifted from the shared frequency by the frequency divider circuitry.

8. The apparatus of claim 1, wherein the first transmission chain and the second transmission chain comprise a shared mixer;
wherein the shared PLL output is coupled to a LO input of the shared mixer; and
wherein transmission circuitry of the second transmission chain is coupled to an output of the shared mixer via frequency divider circuitry.

9. The apparatus of claim 8, wherein transmission circuitry of the first transmission chain is separate from the transmission circuitry of the second transmission chain and is coupled to the output of the shared mixer without intervening frequency divider circuitry.

10. The apparatus of claim 8, wherein the radar signal generation circuitry comprises shared frequency modulated continuous wave-intermediate frequency (FMCW-IF) signal generation circuitry coupled to a signal input of the shared mixer.

11. The apparatus of claim 3, wherein the first frequency divider circuitry comprises a programmable divider.

12. The apparatus of claim 1, wherein the first transmission chain and the second transmission chain share frequency modulated continuous wave-intermediate frequency (FMCW-IF) circuitry and IQ generation circuitry coupled to the FMCW-IF circuitry;
wherein a first output of the IQ generation circuitry is coupled to transmission circuitry of the first transmission chain via a first mixer of the first transmission chain;
wherein a second output of the IQ generation circuitry is coupled to transmission circuitry of the second transmission chain via a second mixer of the second transmission chain.

13. The apparatus of claim 1, wherein the apparatus is configured to transmit multiple radar signals concurrently at different respective frequencies via the first transmission chain and the second transmission chain.

14. The apparatus of claim 1, wherein the first transmission chain and the second transmission share frequency modulated continuous wave-intermediate frequency (FMCW-IF) circuitry.

15. The apparatus of claim 14, wherein a first output of the FMCW-IF circuitry is coupled to transmission circuitry of the first transmission chain via a first mixer of the first transmission chain;
wherein a second or split output of the FMCW-IF circuitry is coupled to transmission circuitry of the second transmission chain via a second mixer of the second transmission chain.

16. The apparatus of claim 15, wherein the second or split output of the FMCW-IF circuitry is coupled to the second mixer via frequency adjustment circuitry.

17. The apparatus of claim 16, wherein the frequency adjustment circuitry comprises interference reduction circuitry.

18. The apparatus of claim 16, wherein the frequency adjustment circuitry comprises frequency offset circuitry.

19. The apparatus of claim 1, wherein the first transmission chain generates a first signal, and wherein the second transmission chain generates a second signal orthogonal to the first signal.

20. The apparatus of claim 19, wherein the first signal is a first pseudorandom (PN) shaped signal, and wherein the second signal is a second PN shaped signal orthogonal to the first PN shaped signal.

21. The apparatus of claim 1,
wherein the first transmission chain and the second transmission chain are configured for transmission in a first transmission direction;
wherein a chirp pattern for a transmission signal of the first transmission chain is orthogonal to a chirp pattern of a transmission signal of the second transmission chain.

22. The apparatus of claim 21, wherein a third transmission chain and a fourth transmission chain are configured for transmission in a second transmission direction orthogonal to the first transmission direction; and
wherein a chirp pattern for a transmission signal of the third transmission chain is orthogonal to a chirp pattern of a transmission signal of the fourth transmission chain.

23. The apparatus of claim 1, further comprising a shared receive path; and
processing circuitry configured to perform source separation on received signals to identify separate return chirp signals from the first transmission chain and the second transmission chain.

24. The apparatus of claim 23, wherein the processing circuitry is configured to identify the separate return chirp signals using a trained source separation machine learning algorithm.

25. The apparatus of claim 24, wherein the trained source separation machine learning algorithm identifies the separate return chirp signals using one or more of a signal level, a signal index, a signal slope-direction, and a signal frequency domain.

26. The apparatus of claim 1, wherein the first transmission chain is disposed in a first radio frequency front end (RFFE) module; and
wherein the second transmission chain is disposed in a second RFFE module.

27. The apparatus of claim 26, wherein the first RFFE module comprises a first antenna coupled to the first transmission chain, wherein the first antenna covers a first spatial location;
wherein the second RFFE module comprises a second antenna coupled to the second transmission chain, wherein the second antenna covers a second spatial location different from the first spatial location.

28. A method comprising:
generating a first radar signal using radar signal generation circuitry and a first transmission chain coupled to shared phase locked loop (PLL) circuitry; and
generating a second radar signal using the radar signal generation circuitry and a second transmission chain coupled to the shared PLL circuitry.

29. The method of claim 28, further comprising:
receiving a first return radar signal and a second return radar signal as a joint receive signal on a receive path;
performing source separation on the joint receive signal using a trained source separation machine learning algorithm to identify and separate the separate return signals into the first return radar signal associated with the first radar signal and the second return radar signal associated with the second radar signal.

30. The method of claim 29, wherein the trained source separation machine learning algorithm identifies the separate return signals using one or more of a signal level, a signal index, a signal slope-direction, and a signal frequency domain.

\* \* \* \* \*